(12) United States Patent
Kim et al.

(10) Patent No.: US 12,482,699 B2
(45) Date of Patent: Nov. 25, 2025

(54) MANUFACTURING METHOD OF SEMICONDUCTOR DEVICE INCLUDING FORMING A RECESS FILLING PATTERN

(71) Applicant: SAMSUNG ELECTRONICS CO., LTD., Suwon-si (KR)

(72) Inventors: Youngin Kim, Incheon (KR); Jonghyuk Park, Hwaseong-si (KR); Byoungho Kwon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 522 days.

(21) Appl. No.: 18/092,239

(22) Filed: Dec. 31, 2022

(65) Prior Publication Data

US 2023/0260828 A1   Aug. 17, 2023

(30) Foreign Application Priority Data

Feb. 15, 2022   (KR) .......................... 10-2022-0019450

(51) Int. Cl.
  *H10B 12/00*   (2023.01)
  *H01L 21/762*   (2006.01)
  *H10D 64/01*   (2025.01)

(52) U.S. Cl.
  CPC ..... *H01L 21/76229* (2013.01); *H10B 12/053* (2023.02); *H10B 12/09* (2023.02);
  (Continued)

(58) Field of Classification Search
  CPC ...... H10B 12/053; H10B 12/09; H10B 12/34; H10B 12/482; H10B 12/50; H10B 12/315;
  (Continued)

(56) References Cited

U.S. PATENT DOCUMENTS 5,893,744 A * 4/1999 Wang .................... H01L 23/544
                                                              438/401
7,319,062 B2 * 1/2008 Hong ................ H01L 21/76224
                                                              257/E21.549
(Continued)

FOREIGN PATENT DOCUMENTS

KR   10-2000-0026376   5/2000
TW   202141761   11/2021

OTHER PUBLICATIONS

Office Action issued in Corresponding Application No. TW 112104421 on Oct. 11, 2023.

*Primary Examiner* — Maliheh Malek
(74) *Attorney, Agent, or Firm* — Morgan, Lewis & Bockius LLP

(57) ABSTRACT

A manufacturing method of a semiconductor device includes: etching a substrate, thereby forming a cell trench and a dummy trench; forming a preliminary isolation structure on the substrate, wherein a first dummy recess is formed in the preliminary isolation structure and overlaps with the dummy trench; forming a lower mask layer on the preliminary isolation structure, wherein a second dummy recess is formed in the lower mask layer and overlaps with the first dummy recess; forming a dummy recess filling pattern filling the second dummy recess; forming an upper mask layer on the lower mask layer and the dummy recess filling pattern; forming a gate trench using the lower mask layer and the upper mask layer as a mask; and forming a gate structure in the gate trench.

20 Claims, 43 Drawing Sheets

(52) U.S. Cl.
CPC ........... *H10D 64/027* (2025.01); *H10B 12/34* (2023.02); *H10B 12/482* (2023.02)

(58) Field of Classification Search
CPC .. H10B 12/0335; H10B 12/485; H10B 12/00; H10B 12/033; H10B 12/36; H10B 12/48; H10B 41/50; H01L 21/76229; H10D 64/027; H10D 64/513; H10D 84/0135; H10D 84/016; H10D 84/038; H10D 84/0151; H10D 84/0144
See application file for complete search history.

(56) References Cited

U.S. PATENT DOCUMENTS

| | | | | |
|---|---|---|---|---|
| 7,319,073 | B2 * | 1/2008 | Jhang | H01L 23/544 257/E21.546 |
| 7,358,588 | B2 * | 4/2008 | Youn | H01L 21/76224 257/E21.549 |
| 7,557,415 | B2 * | 7/2009 | Youn | H01L 21/76224 257/374 |
| 7,915,121 | B1 * | 3/2011 | Kim | H10B 12/053 257/E21.384 |
| 8,193,580 | B2 * | 6/2012 | Chen | H10D 64/517 257/E29.257 |
| 9,287,159 | B2 * | 3/2016 | Kim | H10B 12/053 |
| 9,306,015 | B2 * | 4/2016 | Lee | H10D 30/665 |
| 9,660,041 | B2 * | 5/2017 | Song | H10B 61/22 |
| 10,109,529 | B2 * | 10/2018 | Koh | H10B 12/50 |
| 11,417,664 | B2 * | 8/2022 | Kang | H10B 12/0335 |
| 11,800,701 | B2 * | 10/2023 | An | H10B 12/485 |
| 12,048,145 | B2 * | 7/2024 | Won | H10B 12/488 |
| 2011/0165747 | A1 * | 7/2011 | Kim | H10B 12/053 438/270 |
| 2014/0110786 | A1 * | 4/2014 | Kim | H10B 12/34 257/365 |
| 2014/0197876 | A1 * | 7/2014 | Laven | H01L 21/28238 438/135 |
| 2014/0291758 | A1 * | 10/2014 | Lee | H10D 30/0295 257/331 |
| 2014/0295632 | A1 * | 10/2014 | Lee | H10D 64/117 438/270 |
| 2015/0349074 | A1 * | 12/2015 | Song | H10B 63/30 257/334 |
| 2016/0020213 | A1 * | 1/2016 | Kim | H10B 12/34 438/618 |
| 2016/0118388 | A1 * | 4/2016 | Tonari | H10B 12/34 438/253 |
| 2016/0343709 | A1 * | 11/2016 | Kim | H10D 84/834 |
| 2018/0350818 | A1 * | 12/2018 | Yoon | H10B 12/485 |
| 2019/0273083 | A1 * | 9/2019 | Liou | H10B 12/01 |
| 2019/0326278 | A1 * | 10/2019 | Lee | H10D 84/0177 |
| 2020/0402981 | A1 * | 12/2020 | Kim | H10B 12/0335 |
| 2021/0118886 | A1 * | 4/2021 | Choi | H10B 12/50 |
| 2021/0159241 | A1 * | 5/2021 | Li | H10B 41/50 |
| 2021/0257373 | A1 * | 8/2021 | Kang | H10B 12/482 |
| 2021/0335798 | A1 * | 10/2021 | Lee | H10B 41/70 |
| 2022/0037508 | A1 * | 2/2022 | Kim | H10B 10/18 |
| 2022/0189968 | A1 * | 6/2022 | Park | H10B 12/053 |
| 2023/0079697 | A1 * | 3/2023 | Lee | H10D 30/43 257/351 |
| 2023/0209808 | A1 * | 6/2023 | Choi | H10B 12/053 257/306 |
| 2023/0260828 | A1 * | 8/2023 | Kim | H10D 64/027 438/259 |
| 2023/0290827 | A1 * | 9/2023 | Vellei | H10D 12/032 |
| 2024/0128082 | A1 * | 4/2024 | Naoki | H01L 21/0332 |
| 2024/0130103 | A1 * | 4/2024 | Huang | H10B 12/09 |
| 2024/0284664 | A1 * | 8/2024 | Kim | H10B 12/09 |
| 2024/0312843 | A1 * | 9/2024 | Lin | H10D 84/0151 |
| 2024/0324188 | A1 * | 9/2024 | Kim | H10B 12/488 |
| 2024/0349484 | A1 * | 10/2024 | Eom | H10B 12/50 |

* cited by examiner

MANUFACTURING METHOD OF SEMICONDUCTOR DEVICE INCLUDING FORMING A RECESS FILLING PATTERN

CROSS-REFERENCE TO THE RELATED APPLICATION

This application claims priority under 35 U.S.C. 119(a) to Korean Patent Application No. 10-2022-0019450, filed on Feb. 15, 2022, in the Korean Intellectual Property Office, the disclosure of which is incorporated by reference herein in its entirety.

TECHNICAL FIELD

The exemplary embodiments of the present inventive concept relate to a manufacturing method of a semiconductor device. More particularly, the exemplary embodiments of the present inventive concept relate to a manufacturing method of a semiconductor device including forming a recess filling pattern.

DISCUSSION OF THE RELATED ART

A semiconductor device is becoming increasingly important in electronics industries by virtue of its characteristics such as miniaturization, multifunctionalization, low manufacturing costs, etc. Semiconductor devices may typically be classified into a semiconductor memory device that is configured to store logic data, a semiconductor logic device that is configured to arithmetically process logic data, a hybrid semiconductor device that includes a memory element and a logic element, etc. In accordance with advances in electronics industries, demand for characteristics of semiconductor devices is gradually increasing. For example, desires for high reliability, high speed, multifunctionalization, etc. of semiconductor devices is gradually increasing. To satisfy such desired characteristics, structures in semiconductor devices become increasingly complicated. In addition, semiconductor devices become increasingly integrated.

SUMMARY

According to an exemplary embodiment of the present inventive concept, a manufacturing method of a semiconductor device includes: etching a substrate, thereby forming a cell trench and a dummy trench; forming a preliminary isolation structure on the substrate, wherein a first dummy recess is formed in the preliminary isolation structure and overlaps with the dummy trench; forming a lower mask layer on the preliminary isolation structure, wherein a second dummy recess is formed in the lower mask layer and overlaps with the first dummy recess; forming a dummy recess filling pattern filling the second dummy recess; forming an upper mask layer on the lower mask layer and the dummy recess filling pattern; forming a gate trench using the lower mask layer and the upper mask layer as a mask; and forming a gate structure in the gate trench.

According to an exemplary embodiment of the present inventive concept, a manufacturing method of a semiconductor device includes: etching a substrate, thereby forming a cell trench and a dummy trench; forming a lower mask layer over the substrate, wherein the lower mask layer includes a cell recess and a dummy recess, wherein the cell recess overlaps with the cell trench, and the dummy recess overlaps with the dummy trench; forming a dummy recess filling pattern, which fills the dummy recess, and a cell recess filling pattern, which fills the cell recess; forming an upper mask layer on the lower mask layer, the dummy recess filling pattern and the cell recess filling pattern; forming a gate trench using the lower mask layer and the upper mask layer as a mask; and forming a gate structure in the gate trench.

According to an exemplary embodiment of the present inventive concept, a manufacturing method of a semiconductor device includes: etching a substrate, thereby forming a cell trench and a dummy trench; forming a first preliminary isolation layer on the substrate; forming a second preliminary isolation layer on the first preliminary isolation layer; forming a first dummy isolation layer in the dummy trench and on the second preliminary isolation layer; removing an upper portion of the second preliminary isolation layer, thereby forming a second dummy isolation layer between the first preliminary isolation layer and the first dummy isolation layer, wherein the first and second dummy isolation layers and the first preliminary isolation layer defines a first dummy recess overlapping with the dummy trench; forming a lower mask layer that fills the first dummy recess, wherein the lower mask layer includes a second dummy recess overlapping with the first dummy recess; forming a recess filling layer on the lower mask layer; removing an upper portion of the recess filling layer, thereby forming a dummy recess filling pattern that fills the second dummy recess; forming an upper mask layer on the lower mask layer and the dummy recess filling pattern; forming a gate trench using the upper mask layer and the lower mask layer as a mask; and forming a gate structure in the gate trench.

DETAILED DESCRIPTION OF EXEMPLARY EMBODIMENTS

Figure 1A:
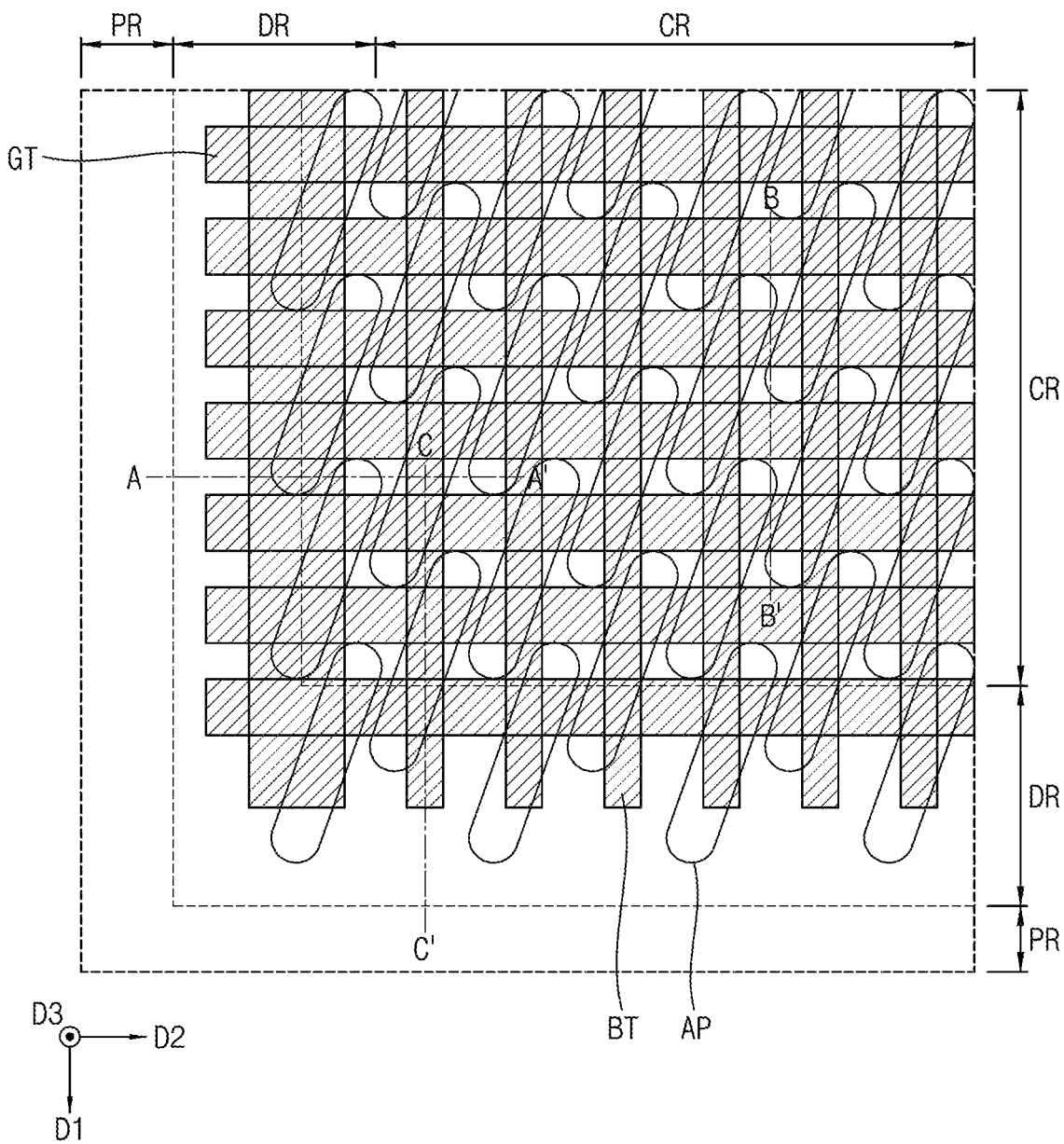
FIG. 1A is a plan view of a semiconductor device according to an exemplary embodiment of the present inventive concept.
Figure 1B:
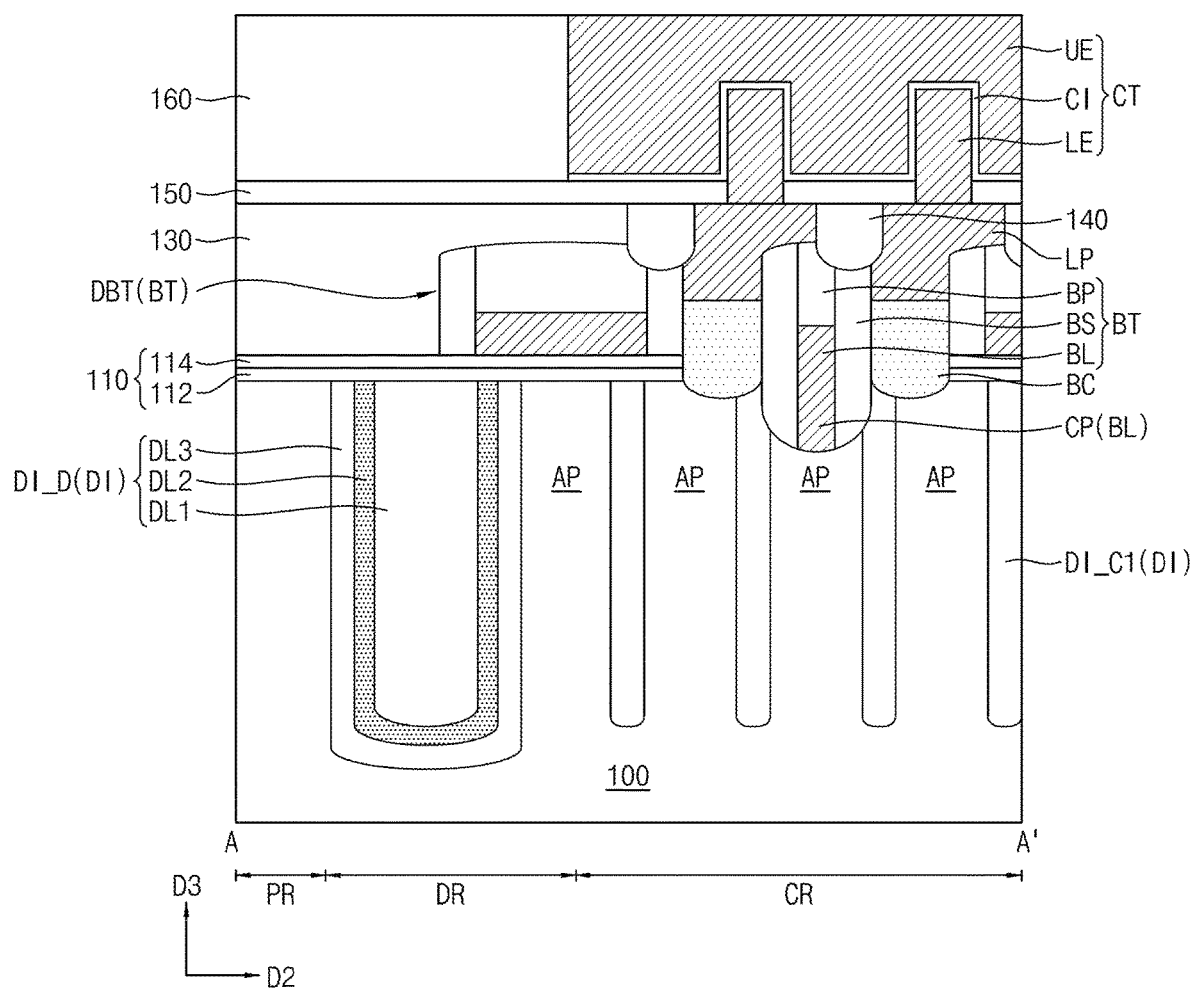
FIG. 1B is a cross-sectional view taken along line A-A' in FIG. 1A.
Figure 1C:
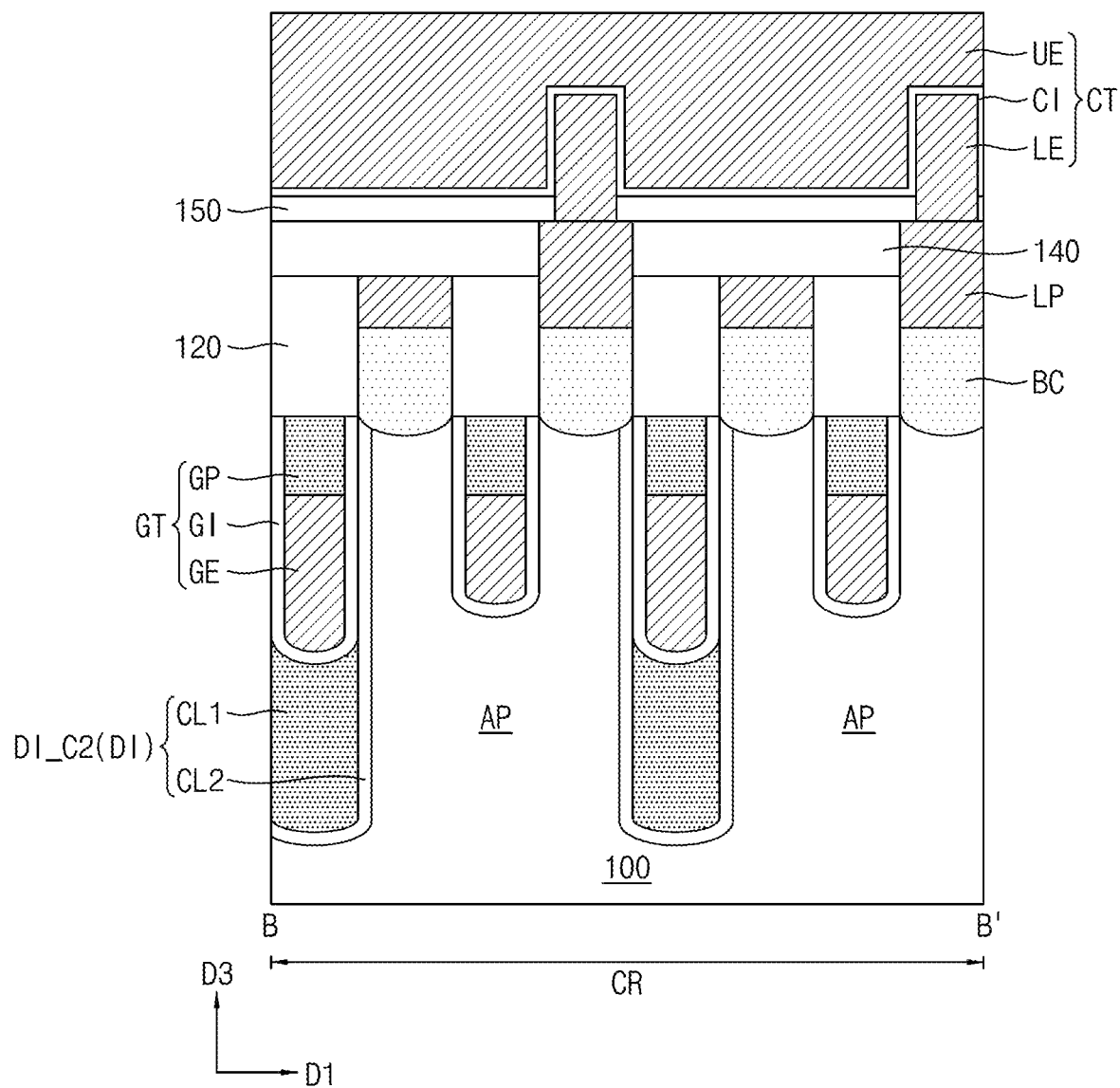
FIG. 1C is a cross-sectional view taken along line B-B' in FIG. 1A.
Figure 1D:
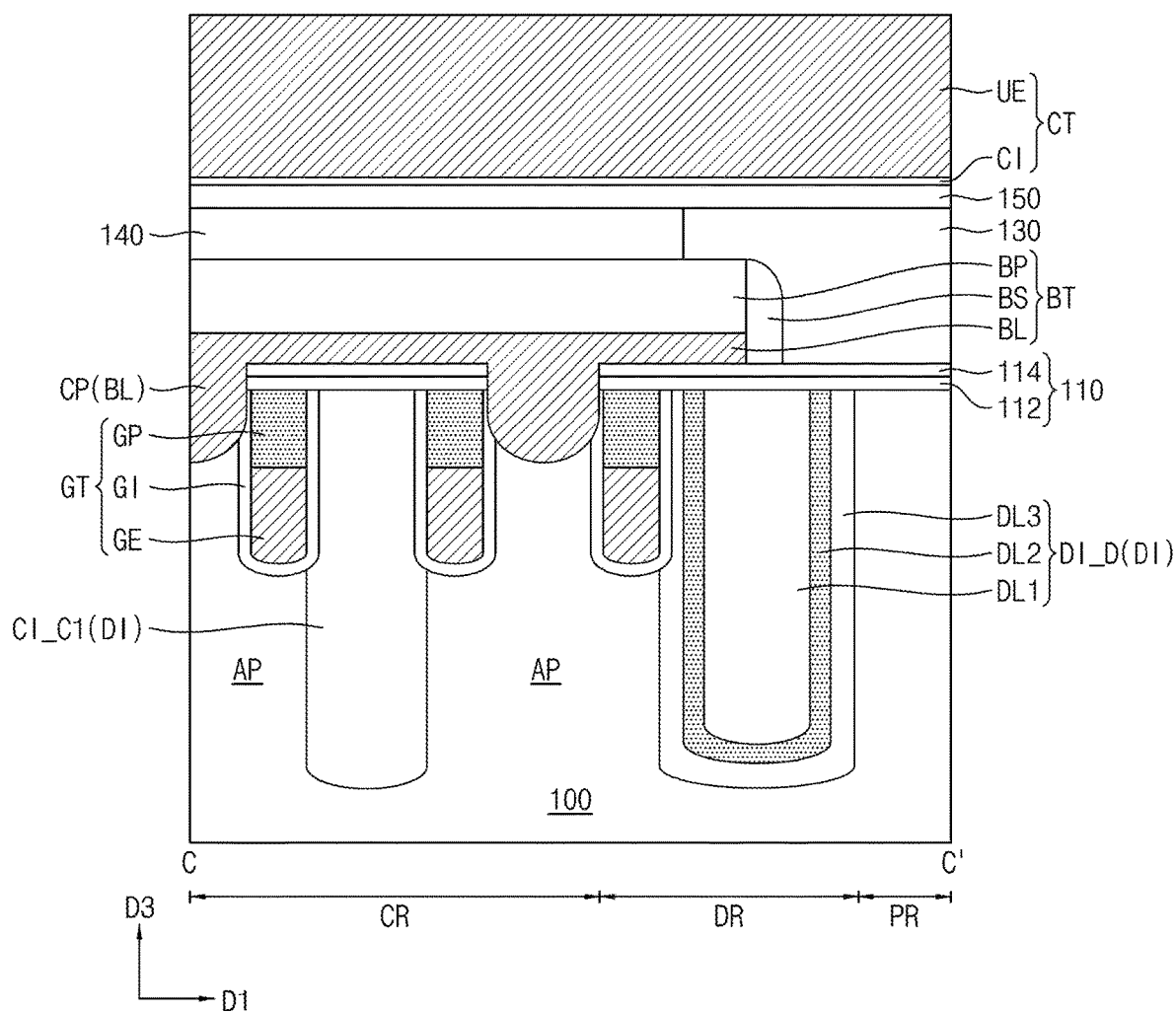
FIG. 1D is a cross-sectional view taken along line C-C' in FIG. 1A.

FIG. 1A is a plan view of a semiconductor device according to an exemplary embodiment of the present inventive concept. FIG. 1B is a cross-sectional view taken along line A-A' in FIG. 1A. FIG. 1C is a cross-sectional view taken along line B-B' in FIG. 1A. FIG. 1D is a cross-sectional view taken along line C-C' in FIG. 1A.

Referring to FIGS. 1A, 1B, 1C, and 1D, the semiconductor device may include a cell region CR, a dummy region DR, and a peripheral region PR. The cell region CR, the dummy region DR, and the peripheral region PR may be regions divided from one another on a plane defined by a first direction D1 and a second direction D2. The first direction D1 and the second direction D2 may intersect each other. For example, the first direction D1 and the second direction D2 may be horizontal directions substantially perpendicularly intersecting each other.

The peripheral region PR may be a region in which peripheral transistors of the semiconductor device are disposed. The cell region CR may be a region in which cell transistors of the semiconductor device are disposed. The dummy region DR may be a region in which dummy transistors of the semiconductor device are disposed. The peripheral region PR may at least partially surround the cell region CR and the dummy region DR. The dummy region DR may at least partially surround the cell region CR.

The semiconductor device may include a substrate 100. In an exemplary embodiment of the present inventive concept, the substrate 100 may be a semiconductor substrate. For example, the substrate 100 may include silicon, germanium, silicon-germanium, GaP, or GaAs. In an exemplary embodiment of the present inventive concept, the substrate 100 may be a silicon-on-insulator (SOI) substrate or a germanium-on-insulator (GOI) substrate. The substrate 100 may have the form of a plate extending along a plane defined by the first direction D1 and the second direction D2.

The substrate 100 may include active patterns AP. The active patterns AP may be disposed in the cell region CR and the dummy region DR. Upper portions of the substrate 100 protruding in a third direction D3 in the cell region CR and the dummy region DR may be an active patterns AP. The third direction D3 may intersect the first direction D1 and the second direction D2. For example, the third direction D3 may be a vertical direction perpendicularly intersecting the first direction D1 and the second direction D2. The active patterns AP may be spaced apart from one another.

A device isolation layer DI surrounding the active patterns AP may be provided. The active patterns AP may be defined by the device isolation layer DI. The device isolation layer DI may include first cell isolation portions DI_C1, second cell isolation portions DI_C2, and dummy isolation portions DI_D. The first cell isolation portions DI_C1 and second cell isolation portions DI_C2 are disposed in the cell region CR, and the dummy isolation portions DI_D are disposed in the dummy region DR. In an exemplary embodiment of the present inventive concept, the first cell isolation portions DI_C1, the second cell isolation portions DI_C2, and the dummy isolation portions DI_D may be interconnected and, as such, may form an integrated structure.

The first cell isolation portion DI_C1 may include an insulating material. For example, the first cell isolation portion DI_C1 may include an oxide. The second cell isolation portion DI_C2 may include a first cell isolation layer CL1 and a second cell isolation layer CL2. The first cell isolation layer CL1 may be disposed on the second cell isolation layer CL2. The second cell isolation layer CL2 may at least partially surround the first cell isolation layer CL1. The first and second cell isolation layers CL1 and CL2 may include an insulating material. In an exemplary embodiment of the present inventive concept, the second cell isolation layer CL2 may include an insulating material different from that of the first cell isolation layer CL1. For example, the first cell isolation layer CL1 may include a nitride, whereas the second cell isolation layer CL2 may include an oxide.

The dummy isolation portion DI_D may include a first dummy isolation layer DL1, a second dummy isolation layer DL2, and a third dummy isolation layer DL3. The second dummy isolation layer DL2 may be provided on the third dummy isolation layer DL3, and the first dummy isolation layer DL1 may be provided on the second dummy isolation layer DL2. The third dummy isolation layer DL3 may at least partially surround the second dummy isolation layer DL2 and the first dummy isolation layer DL1, and the second dummy isolation layer DL2 may at least partially surround the first dummy isolation layer DL. The second dummy isolation layer DL2 may be provided between the first and third dummy isolation layers DL1 and DL3. The first to third dummy isolation layers DL1, DL2 and DL3 may include an insulating material. In an exemplary embodiment of the present inventive concept, the second dummy isolation layer DL2 may include an insulating material different from those of the first dummy isolation layer DL1 and the third dummy isolation layer DL3. For example, the second dummy isolation layer DL2 may include a nitride, whereas the first dummy isolation layer DL1 and the third dummy isolation layer DL3 may each include an oxide.

Gate structures GT extending in the second direction D2 may be provided. The gate structures GT may be spaced apart from one another in the first direction D1. The gate structure GT may be provided on the device isolation layer DI and the active patterns AP. The gate structure GT may be a buried gate structure buried in the active patterns AP and the device isolation layer DI. One gate structure GT may be connected to a plurality of active patterns AP. The active patterns AP may include impurity regions. A cell transistor may be defined by the gate structure GT and the impurity regions of the active pattern AP.

Each of the gate structures GT may include a gate insulating layer GI, a gate electrode GE, and a gate capping layer GP. The gate insulating layer GI may cover surfaces of the active patterns AP and the device isolation layer DI. The gate electrode GE and the gate capping layer GP may be provided inside the gate insulating layer GI. The gate electrode GE may be spaced apart from the active pattern AP by the gate insulating layer GI. The gate insulating layer GI may be disposed between the device isolation layer DI and the gate electrode GE and between the gate capping layer GP and the device isolation layer DI. In addition, the gate insulating layer GI may be disposed between the active pattern AP and the gate electrode GE and between the gate capping layer GP and the active pattern AP. The gate capping layer GP may cover a top surface of the gate electrode GE. The gate insulating layer GI and the gate capping layer GP may include an insulating material. The gate electrode GE may include a conductive material.

Insulating patterns 110 may be provided. Each of the insulating patterns 110 may be provided on at least one of the gate structure GT, the active pattern AP or the device isolation layer DI. The insulating pattern 110 may include a first insulating layer 112, and a second insulating layer 114 on the first insulating layer 112. The first and second insulating layers 112 and 114 may include different insulating materials, respectively. The number of insulating layers included in the insulating pattern 110 is not limited to two. In an exemplary embodiment of the present inventive concept, the insulating pattern 110 may include a single insulating layer or may include three or more insulating layers.

Bit line structures BT extending in the first direction DI may be provided. The bit line structures BT may be spaced apart from one another in the second direction D2. The bit line structure BT may be provided on the insulating pattern 110. The bit line structure BT may be electrically connected to the active pattern AP. From among the bit line structures BT, the bit line structure BT disposed at an outermost side may be a dummy bit line structure DBT.

Each of the bit line structures BT may include a bit line BL, a bit line capping layer BP, and bit line spacers BS. The bit line BL may extend in the first direction D1. The bit line BL may be provided on the insulating pattern 110. The bit line BL may include connection portions CP respectively connected to corresponding ones of the active patterns AP. The bit line BL may include a conductive material. In an exemplary embodiment of the present inventive concept, the bit line BL may include a plurality of conductive layers.

The bit lien capping layer BP may extend in the first direction D1. The bit line capping layer BP may be provided on the bit line BL. The bit line capping layer BP may include an insulating material.

The bit line spacers BS may extend in the first direction D1. The bit line spacers BS may be provided on side walls of the bit line BL and the bit line capping layer BP. The bit line spacers BS may include an insulating material. In an exemplary embodiment of the present inventive concept, the bit line spacer BS may include a plurality of insulating layers.

Insulating fences 120 may be provided. The insulating fences 120 may be provided on the gate capping layer GP of the gate structure GT. The insulating fences 120 may be provided between adjacent ones of the bit line structures BT. The insulating fences 120 may be provided at opposite sides of the bit line structure BT. The insulating fence 120 may include an insulating material.

Buried contacts BC may be provided. The buried contact BC may be connected to the active pattern AP. The buried contacts BC may be provided between adjacent ones of the insulating fences 120. The buried contacts BC may be provided at opposite sides of the insulating fences 120. For example, the buried contacts BC and the insulating fences 120 may be alternately arranged along the first direction D1. The buried contacts BC may include a conductive material.

Landing pads LP may be provided. The landing pad LP may be provided on the buried contact BC. The landing pads LP may be provided between adjacent ones of the insulating fences 120. The landing pads LP may be provided at opposite sides of the insulating fences 120. For example, the landing pads LP and the insulating fences 120 may be alternately arranged along the first direction D1. The landing pad LP may be electrically connected to the active pattern AP via the buried contact BC. The landing pad LP may include a conductive material. In an exemplary embodiment of the present inventive concept, the landing pad LP may include a diffusion barrier layer. In an exemplary embodiment of the present inventive concept, a metal silicide layer may be provided between the landing pad LP and the buried contact BC.

A first cover layer 130 may be provided. The first cover layer 130 may cover the insulating patterns 110 and the bit line structures BT in the dummy region DR and the peripheral region PR. The first cover layer 130 may include an insulating material.

An insulating structure 140 may be provided. The insulating structure 140 may be provided on the bit line structures BT and the insulating fences 120. The insulating structure 140 may space the landing pads LP apart from one another. For example, the insulating structure 140 may be disposed between adjacent landing pads LP. The insulating structure 140 may electrically separate or insulate the landing pads LP from one another. The insulating structure 140 may include an insulating material. In an exemplary embodiment of the present inventive concept, the insulating structure 140 may include a plurality of insulating layers.

An interlayer insulating layer 150 may be disposed on top surfaces of the landing pads LP, the first cover layer 130 and the insulating structure 140. The interlayer insulating layer 150 may include an insulating material.

A capacitor structure CT may be provided on the interlayer insulating layer 150. The capacitor structure CT may include lower electrodes LE, a capacitor insulating layer CI, and an upper electrode UE. The capacitor structure CT may be connected to the landing pad LP. The capacitor structure CT may be electrically connected to the active pattern AP via the landing pad LP and the buried contact BC. In an exemplary embodiment of the present inventive concept, the capacitor structure CT may further include supporters supporting the lower electrodes LE.

The lower electrodes LE may have the form of a pillar extending in the third direction D3 or a rectangular shape. The lower electrode LE may be connected to the landing pad LP while extending through the interlayer insulating layer 150. The lower electrodes LE may include a conductive material.

The capacitor insulating layer CI may cover surfaces of the lower electrodes LE and the interlayer insulating layer 150. In an exemplary embodiment of the present inventive concept, the capacitor insulating layer CI may include a plurality of insulating layers. The capacitor insulating layer CI may include an insulating material.

The upper electrode UE may at least partially surround the lower electrodes LE and the capacitor insulating layer CI. The upper electrode UE may cover the lower electrodes LE and the capacitor insulating layer CI. The lower electrodes LE may be spaced apart from the upper electrode UE by the capacitor insulating layer CI. In other words, the capacitor insulating layer CI may be interposed between the lower electrodes LE and the upper electrode UE. The upper electrode UE may include a conductive material.

A second cover layer 160 covering the capacitor structure CT may be provided. The second cover layer 160 may include an insulating material.

FIGS. 2A, 2B, 2C, 3A, 3B, 3C, 4A, 4B, 4C, 5A, 5B, 5C, 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, and 13C are cross-sectional views showing a manufacturing method of a semiconductor device according to an exemplary embodiment of the present inventive concept. FIGS. 2A, 3A, 4A, 5A, 6A, 7A, 8A, 9A, 10A, 11A, 12A, and 13A correspond to line A-A' in FIG. 1A. FIGS. 2B, 3B, 4B, 5B, 6B, 7B, 8B, 9B, 10B, 11B, 12B, and 13B correspond to line B-B' in FIG. 1A. FIGS. 2C, 3C, 4C, 5C, 6C, 7C, 8C, 9C, 10C, 11C, 12C, and 13C correspond to line C-C' in FIG. 1A.

Figure 2A:
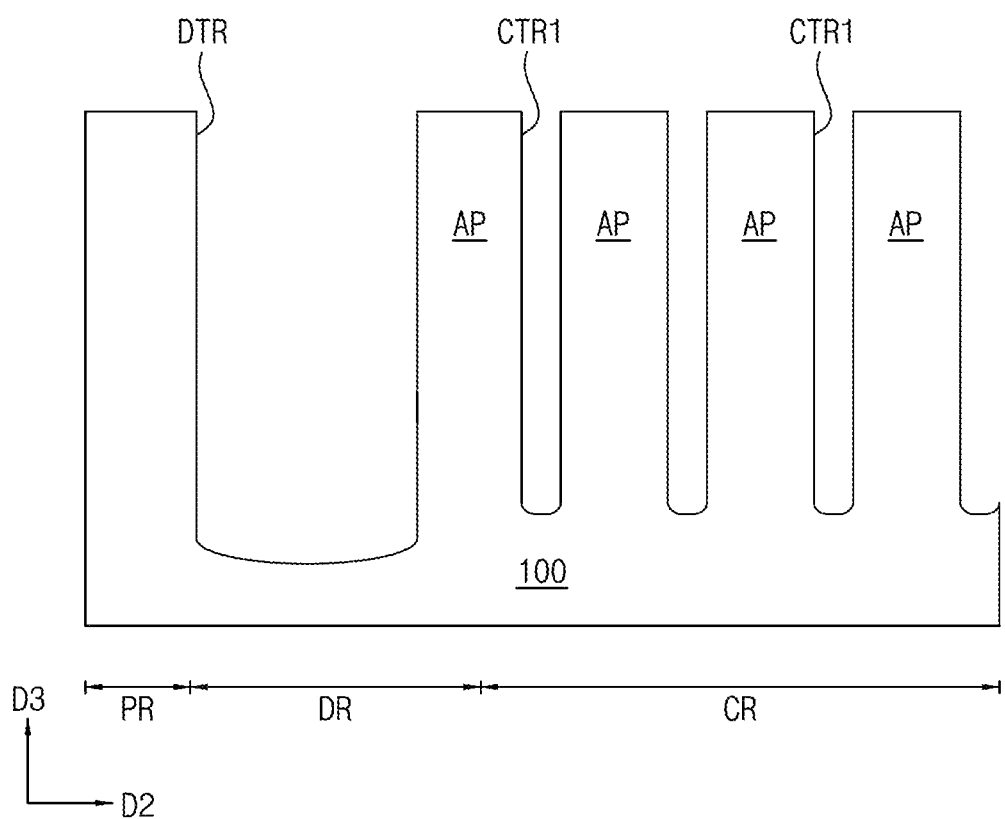
FIGS. 2A, 2B, 2C, 3A, 3B, 3C, 4A, 4B, 4C, 5A, 5B, 5C, 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, and 13C are cross-sectional views showing a manufacturing method of a semiconductor device according to an exemplary embodiment of the present inventive concept.
Figure 2B:
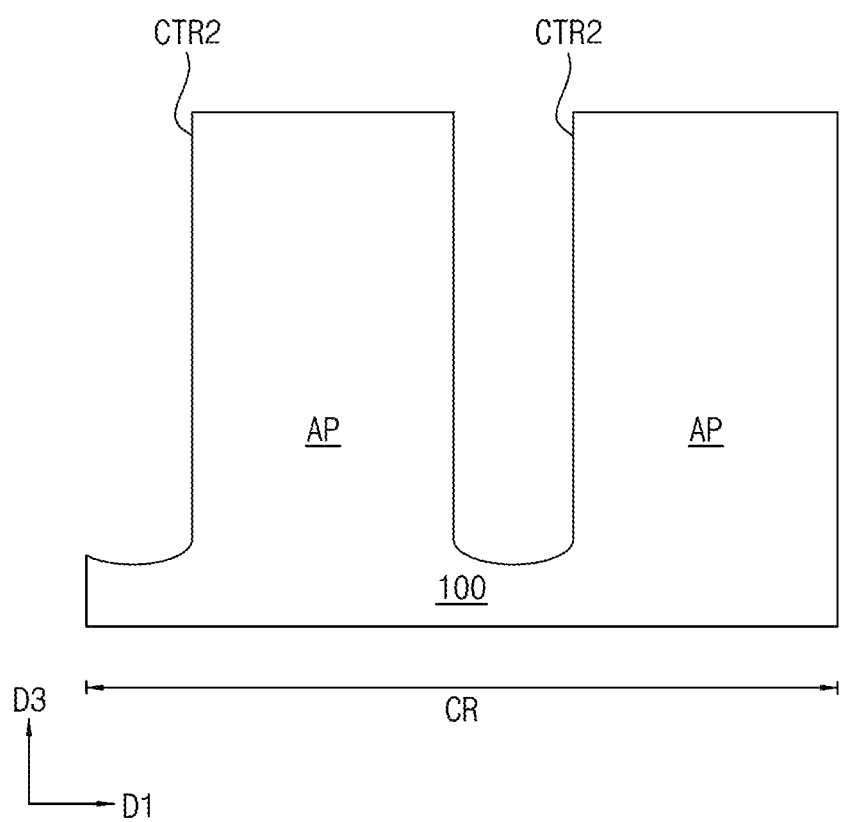
Figure 2C:
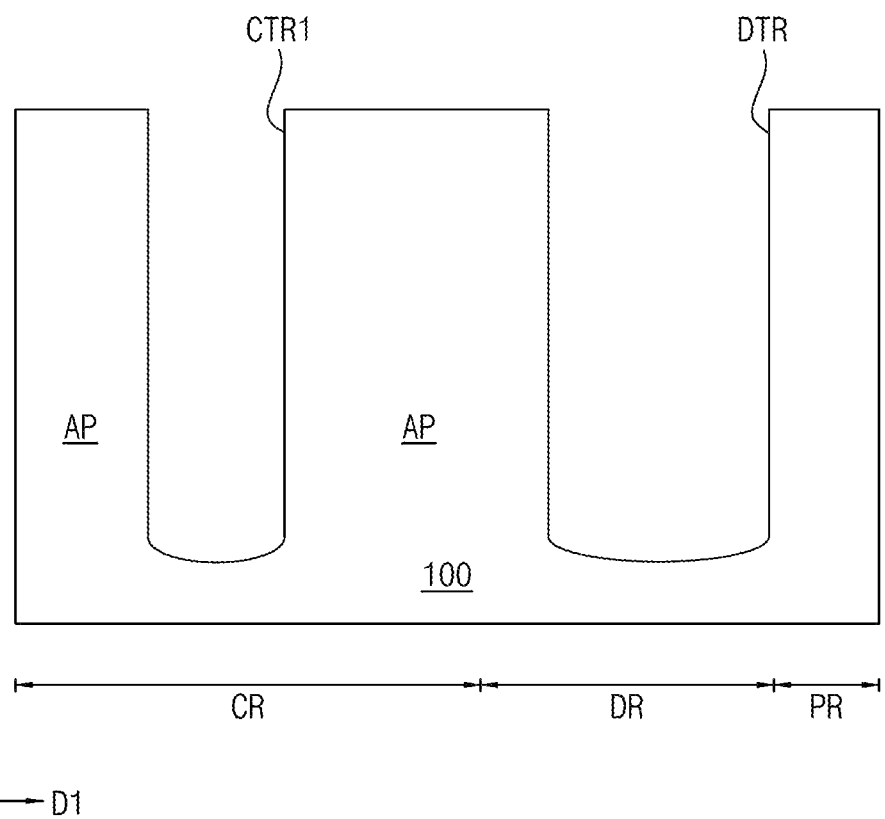

Referring to FIGS. 2A, 2B, and 2C, first cell trenches CTR1, second cell trenches CTR2, and dummy trenches DTR may be formed in a substrate 100. The first cell trenches CTR1, the second cell trenches CTR2, and the dummy trenches DTR may be formed by etching the substrate 100. The first and second cell trenches CTR1 and CTR2 may be formed in a cell region CR. The dummy trenches DTR may be formed in a dummy region CR. The dummy trench DTR may have a greater width than each of the first and second cell trenches CTR1 and CTR2.

In accordance with formation of the first cell trenches CTR1, the second cell trenches CTR2, and the dummy trenches DTR, active patterns AP of the substrate 100 may be defined. In an exemplary embodiment of the present inventive concept, the first cell trenches CTR1, the second cell trenches CTR2, and the dummy trenches DTR may be interconnected and, as such, may form an integrated structure.

Figure 3A:
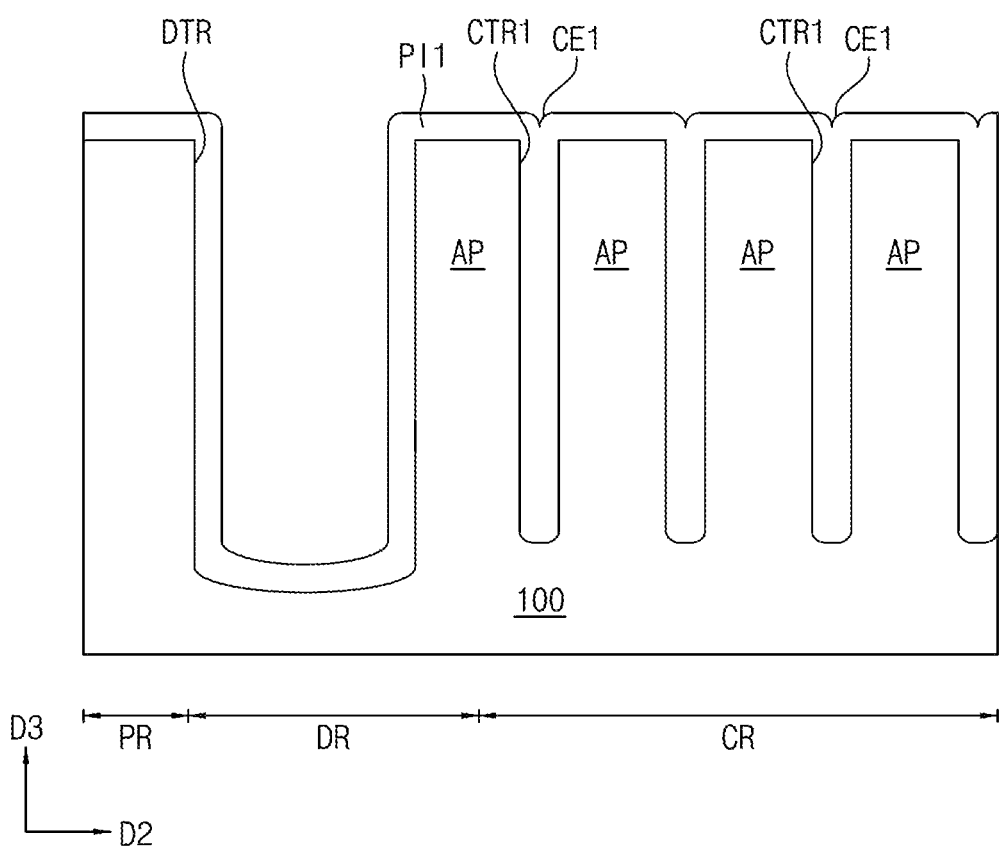
Figure 3B:
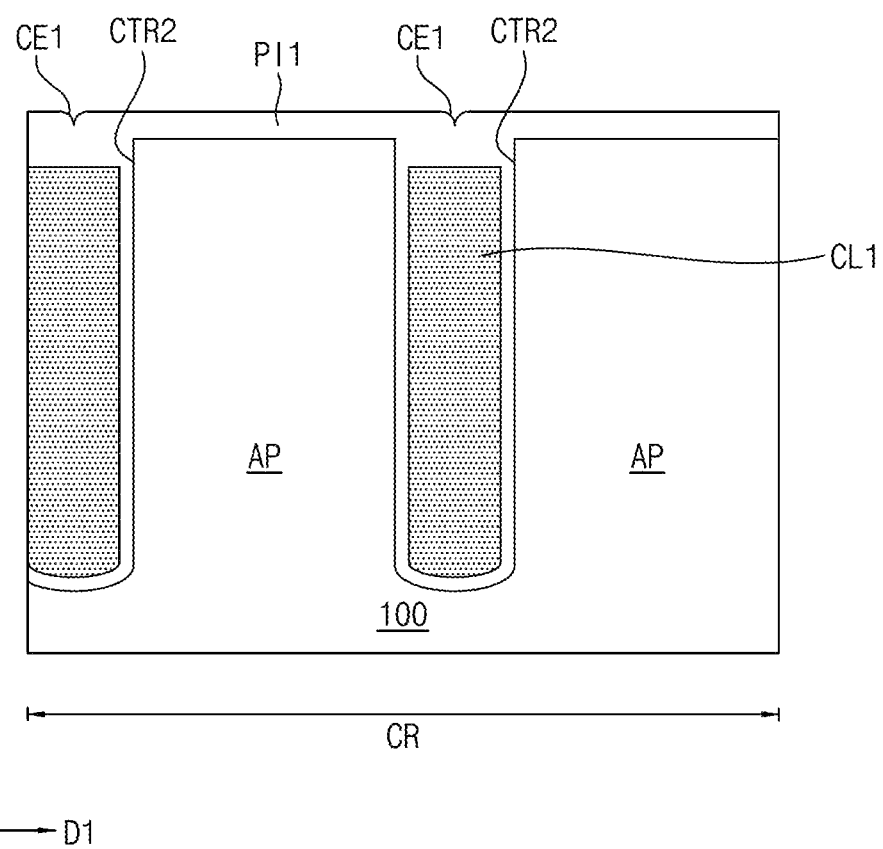
Figure 3C:
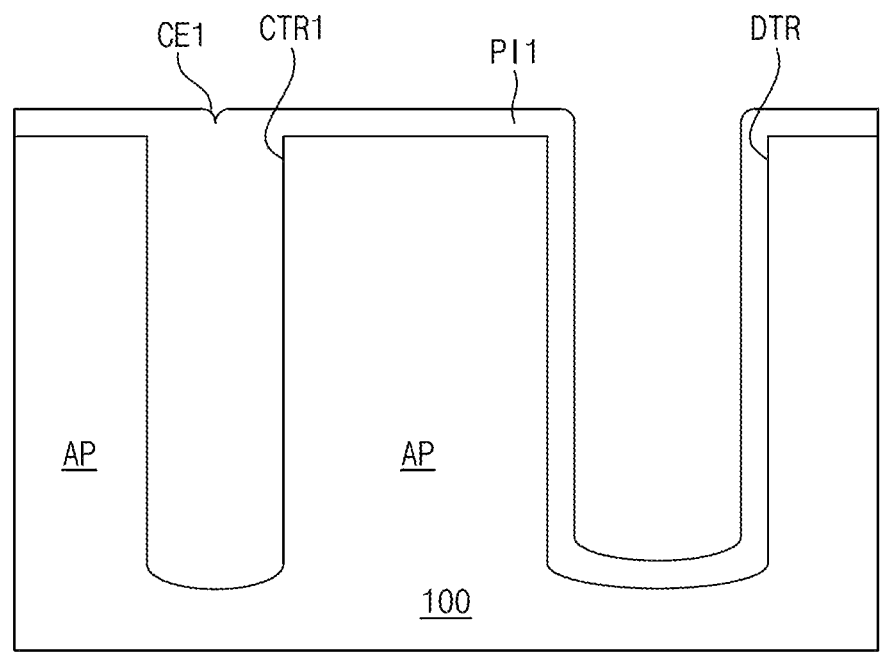
Figure 3C:
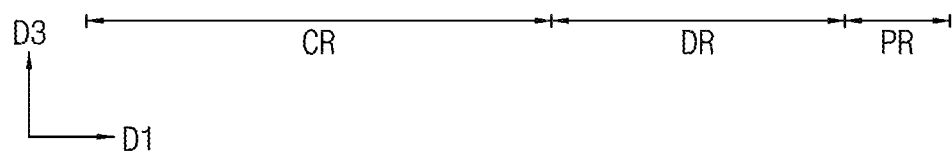

Referring to FIGS. 3A, 3B, and 3C, a first preliminary isolation layer PI1 and a first cell isolation layer CL1 may be formed. The first preliminary isolation layer PI1 may fill the first cell trenches CTR1. The first preliminary isolation layer PI1 and the first cell isolation layer CL1 may fill the second cell trenches CTR2. Filling the second cell trench CTR2 with the first preliminary isolation layer PI1 and the first cell isolation layer CL1 may include forming a portion of the first preliminary isolation layer PI1, thereby covering a surface of the second cell trench CTR2, forming the first cell isolation layer CL1 on the portion of the first preliminary isolation layer PI1, and forming a remaining portion of the first preliminary isolation layer PI1, thereby covering the first cell isolation layer CL1. The first preliminary isolation layer PI1 may be conformally formed on surfaces of the dummy trenches DTR. The first preliminary isolation layer PI1 may fill a portion of the dummy trench DTR. The first preliminary isolation layer PI1 and the first cell isolation layer CL1 may include different insulating materials, respectively. For example, the first preliminary isolation layer PI1 may include an oxide, whereas the first cell isolation layer CL1 may include a nitride.

In accordance with formation of the first preliminary isolation layer PI1, first cell recesses CE1 defined by the first preliminary isolation layer PI1 may be formed. The first cell recess CE1 may be a recessed portion of a top surface of the first preliminary isolation layer PI1. The first cell recesses CE1 may be formed over the first cell trenches CTR1 and/or the second cell trenches CTR2, respectively. The first cell recesses CE1 may overlap with the first cell trenches CTR1 and/or the second cell trenches CTR2 in a third direction D3, respectively.

Figure 4A:
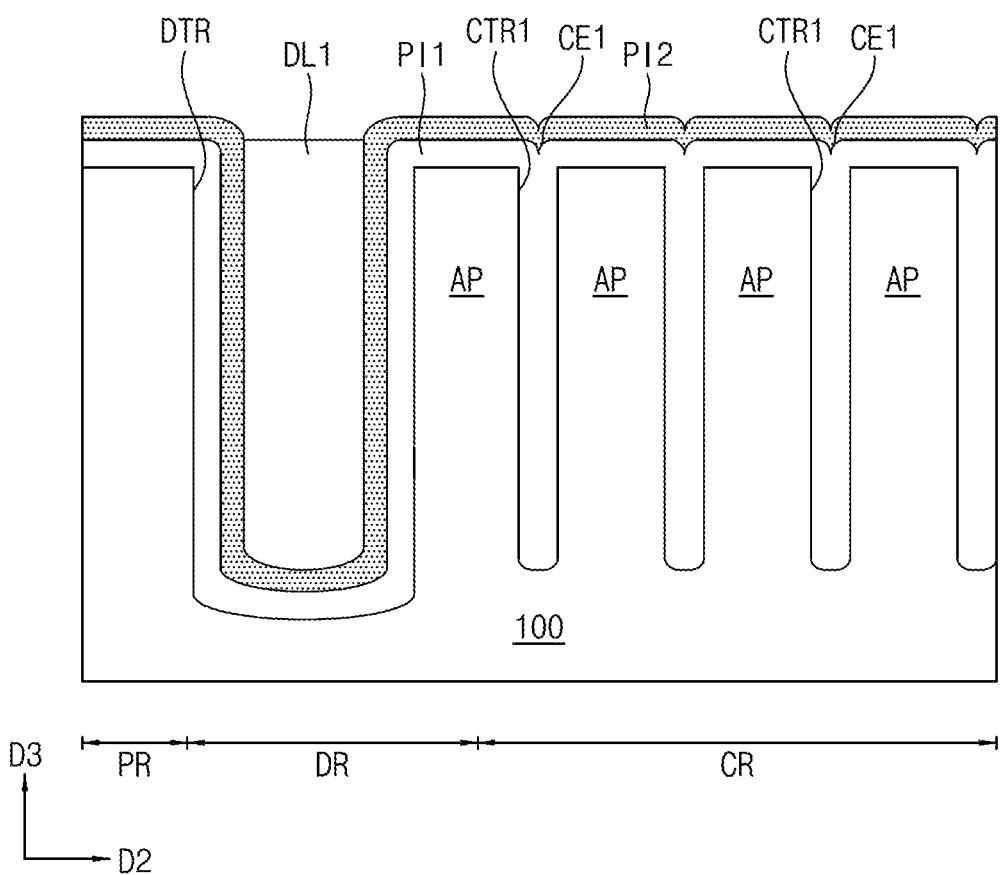
Figure 4B:
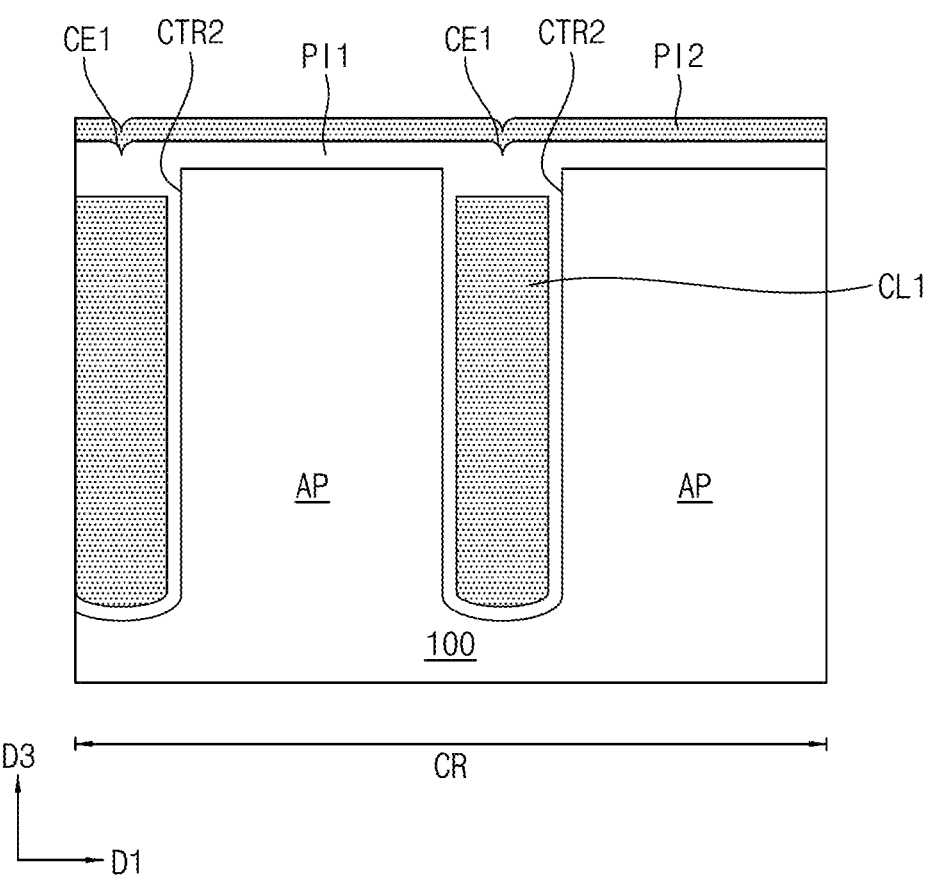
Figure 4C:
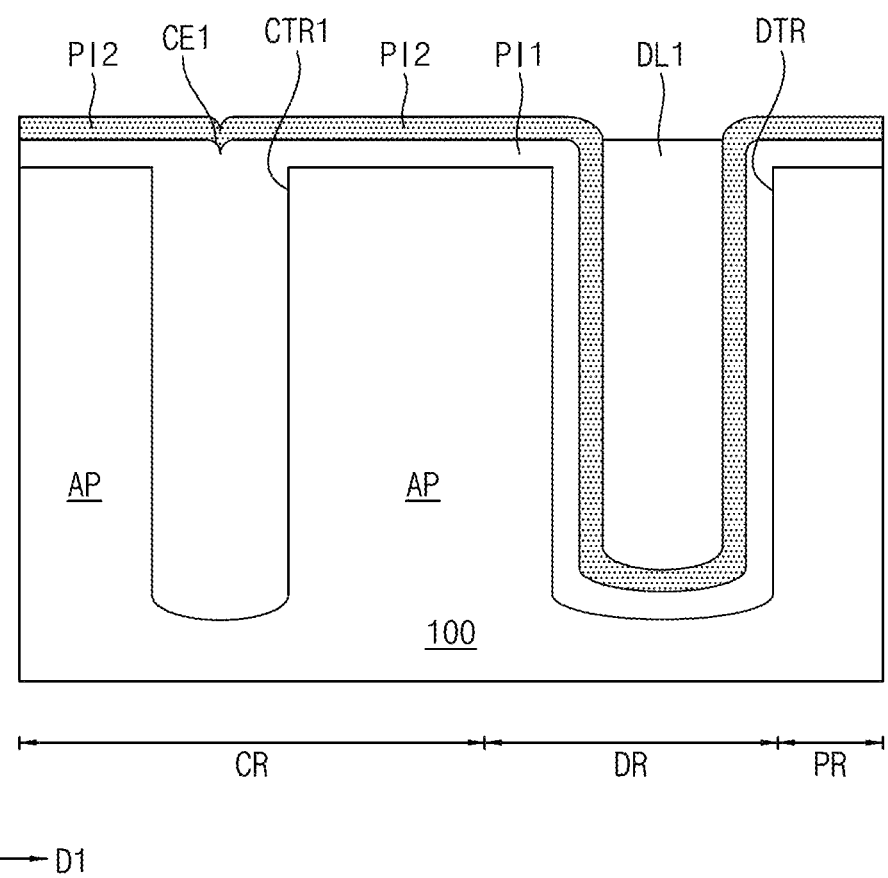

Referring to FIGS. 4A, 4B, and 4C, a second preliminary isolation layer PI2 and a first dummy isolation layer DL1 may be formed. The second preliminary isolation layer PI2 may be conformally formed on the first preliminary isolation layer PI1. The second preliminary isolation layer PI2 may fill the first cell recesses CE1. The second preliminary isolation layer PI2 may fill a portion of the dummy trench DTR. The second preliminary isolation layer PI2 may include an insulating material different from that of the first preliminary isolation layer PI1. For example, the second preliminary isolation layer PI2 may include a nitride.

The first dummy isolation layer DL1 may fill the dummy trench DTR. For example, the first dummy isolation layer DL1 may fill remaining unfilled portions of the dummy trench DTR such that the dummy trench DTR is completely filled. The dummy trench DTR may be filled with the first and second preliminary isolation layers PI1 and PI2 and the first dummy isolation layer DL1. The first dummy isolation layer DLI may be formed on the second preliminary isolation layer PI2 in the dummy trench DTR. Forming the first dummy isolation layer DL1 may include forming an insulating material layer on the second preliminary isolation layer PI2, and removing an upper portion of the insulating material layer.

Figure 5A:
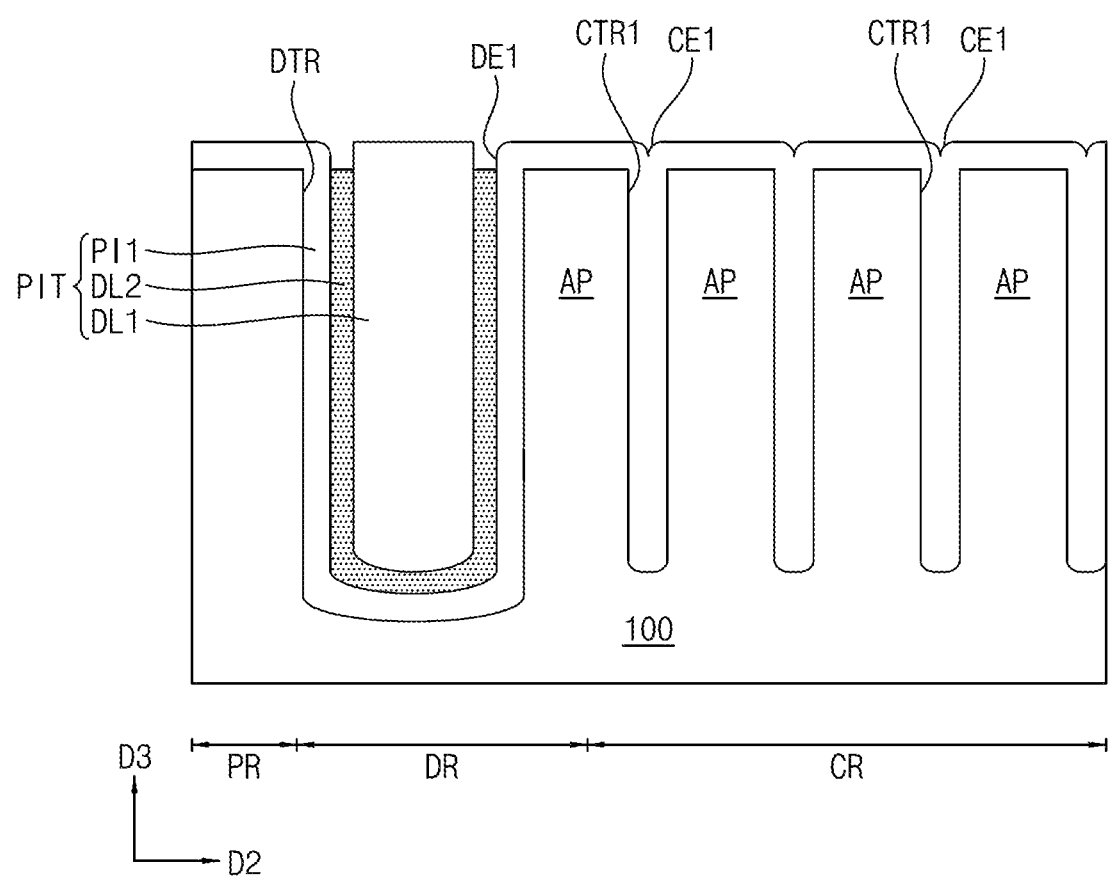
Figure 5B:
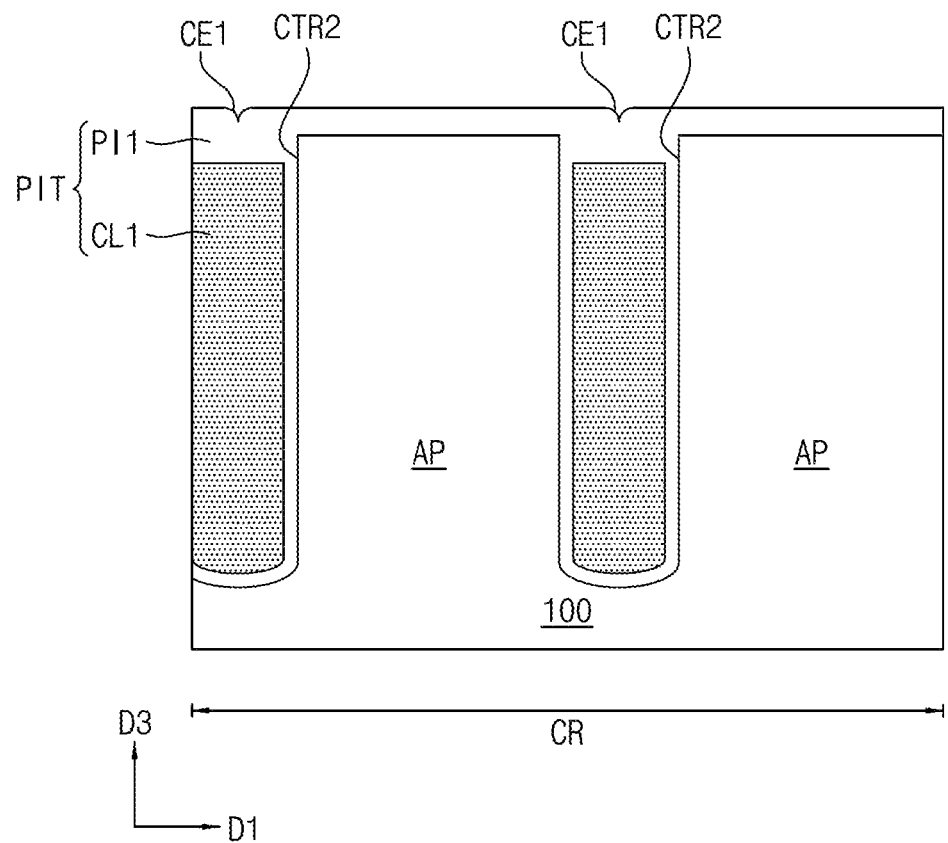
Figure 5C:
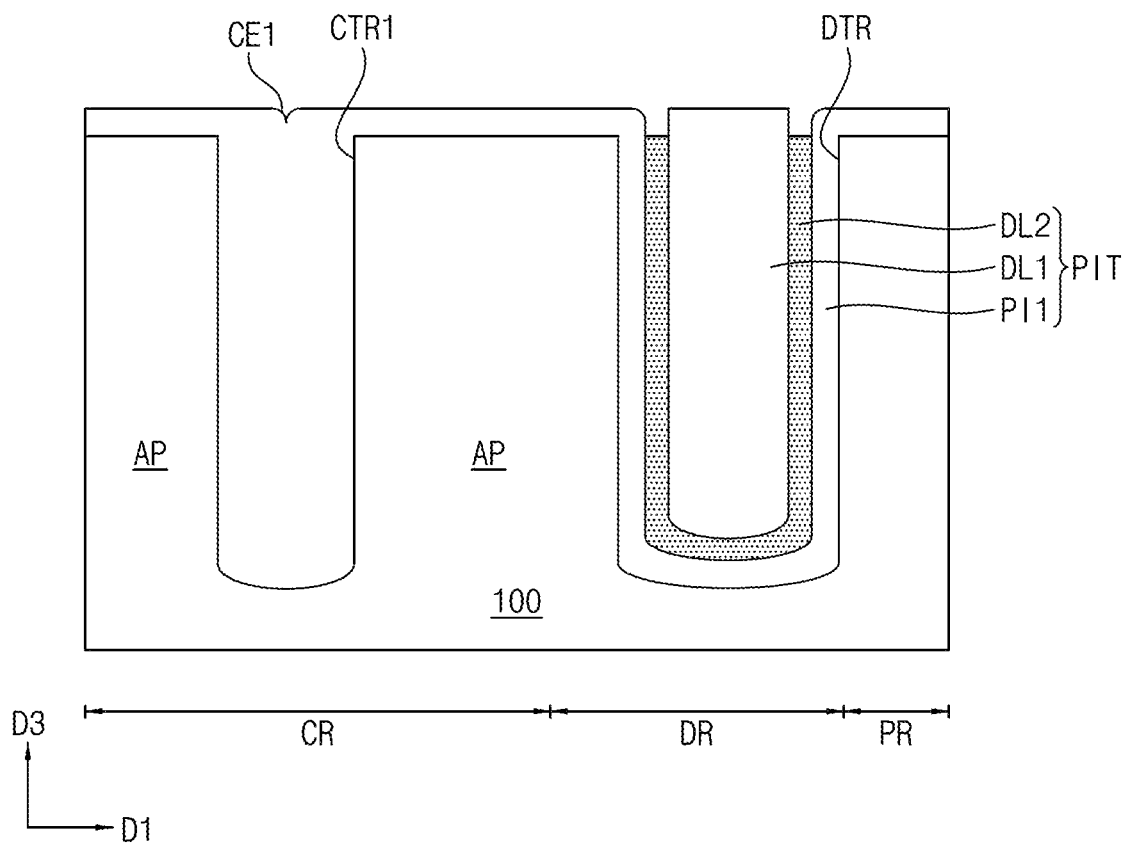

Referring to FIGS. 5A, 5B, and 5C, an upper portion of the second preliminary isolation layer PI2 may be removed. As the upper portion of the second preliminary isolation layer PI2 is removed, portions of the second preliminary isolation layer PI2 disposed in the cell region CR and a peripheral region PR may be removed, and a second dummy isolation layer DL2 may be formed in the dummy trench DTR. The second dummy isolation layer DL2 may be disposed between the first preliminary isolation layer PI1 and the first dummy isolation layer DL1.

As the upper portion of the second preliminary isolation layer PI2 is removed, the first cell recesses CE1 may be exposed. As the second dummy isolation layer DL2 is formed, first dummy recesses DE1 may be defined. The first dummy recesses DE1 may be formed in the dummy trench DTR. The first dummy recess DE1 may be defined by the first dummy isolation layer DL1, the second dummy isolation layer DL2, and the first preliminary isolation layer PI. As the upper portion of the second preliminary isolation layer PI2 is removed, an empty space may be provided between the first dummy isolation layer DL1 and the first preliminary isolation layer PI1. The empty space provided between the first dummy isolation layer DLI and the first preliminary isolation layer PI1 may be the first dummy recess DEL. A top surface of the second dummy isolation layer DL2 may define a bottom surface of the first dummy recess DE1, and the first dummy isolation layer DLI and the first preliminary isolation layer PI may define opposite side walls of the first dummy recess DE1. The first dummy recess DE1 may be disposed over the dummy trench DTR. The dummy recess DE1 may overlap with the dummy trench DTR in the third direction D3.

As the second dummy isolation layer DL2 is formed, a preliminary isolation structure PIT on the substrate 100 may be formed. The preliminary isolation structure PIT may include the first preliminary isolation layer PI1, the first dummy isolation layer DL1, the second dummy isolation layer DL2, and the first cell isolation layer CL1. Forming the preliminary isolation structure PIT on the substrate 100 may include forming the first preliminary isolation layer PI1, the first cell isolation layer CL1, the first dummy isolation layer DL1, and the second dummy isolation layer DL2. The first dummy recesses DE1 and the first cell recesses CE1 may be formed in the preliminary isolation structure PIT.

Figure 6A:
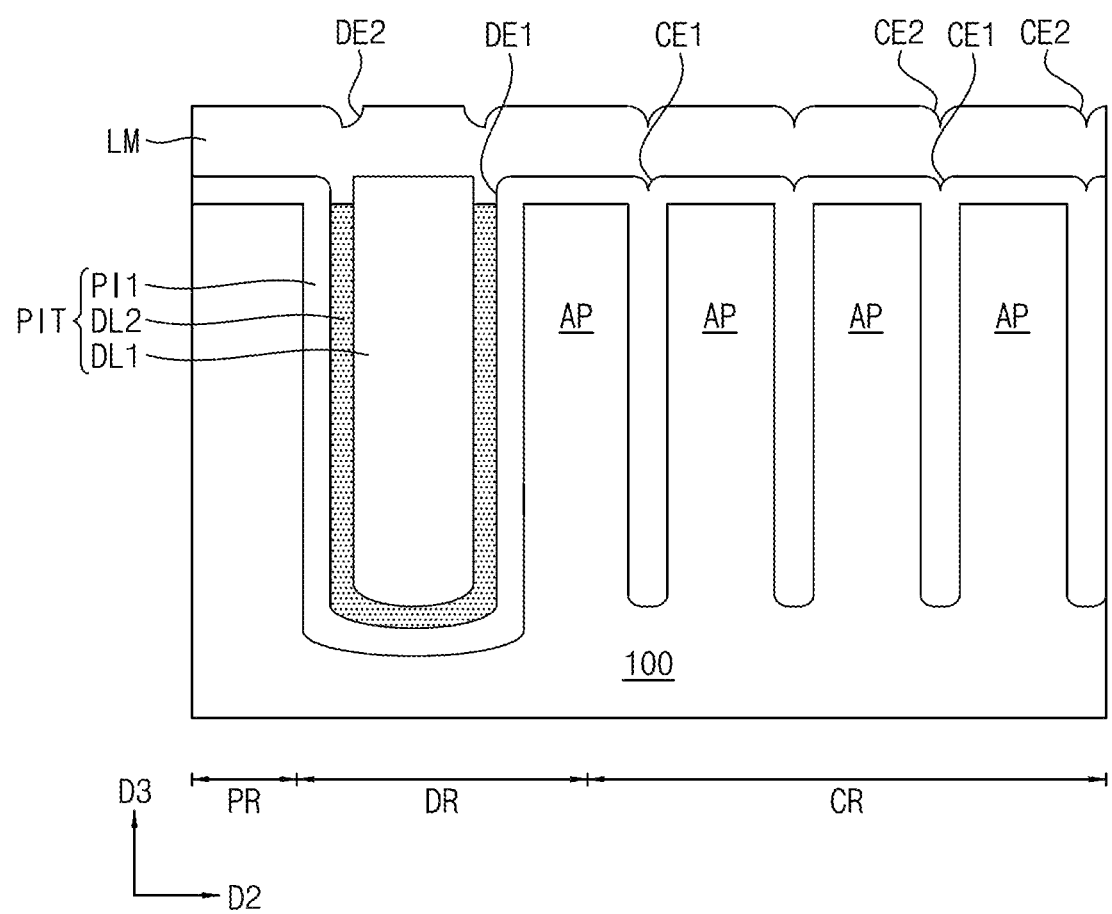
Figure 6B:
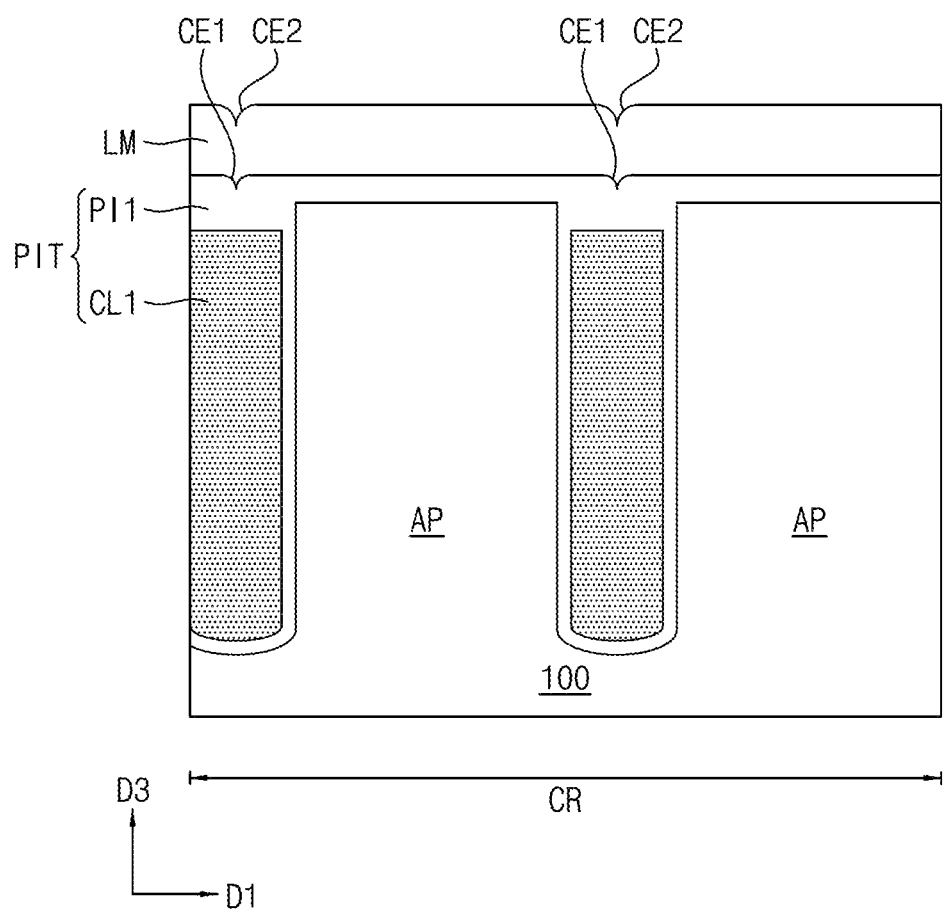
Figure 6C:
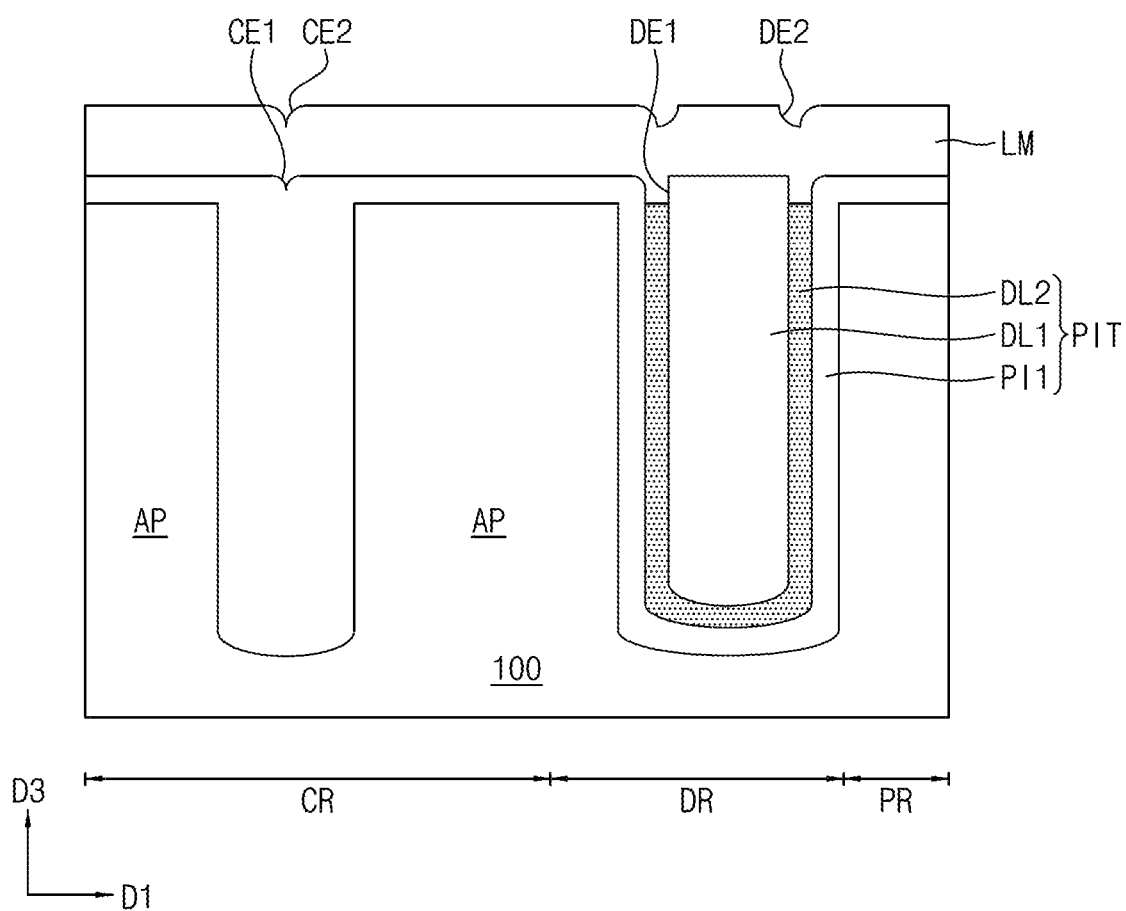

Referring to FIGS. 6A, 6B, and 6C, a lower mask layer LM may be formed on the preliminary isolation structure PIT. The lower mask layer LM may be formed on the first preliminary isolation layer PI1 and the first and second dummy isolation layers DL1 and DL2. The lower mask layer LM may fill the first cell recesses CE1 and the first dummy recesses DE1. The lower mask layer LM may be formed over the substrate 100.

Second cell recesses CE2 and second dummy recesses DE2 may be formed in the lower mask layer LM. The second cell recesses CE2 and the second dummy recesses DE2 may be recessed portions of a top surface of the lower mask layer LM. The second cell recesses CE2 may be formed through transfer of the first cell recesses CE1, and the second dummy recesses DE2 may be formed through transfer of the first dummy recesses DE1. The second cell recess CE2 may be formed over the first cell recess CE1. The second cell recess CE2 may overlap with the first cell recess CE1 in the third direction D3. The second dummy recess DE2 may be formed over the first dummy recess DE1. The second dummy recess DE2 may overlap with the first dummy recess DE1 in the third direction D3. The lower mask layer LM may include an insulating material different from that of the second dummy isolation layer DL2. For example, the lower mask layer LM may include an oxide. In an exemplary embodiment of the present inventive concept, the lower mask layer LM may be formed through a low-temperature atomic layer deposition (LTALD) process.

Figure 7A:
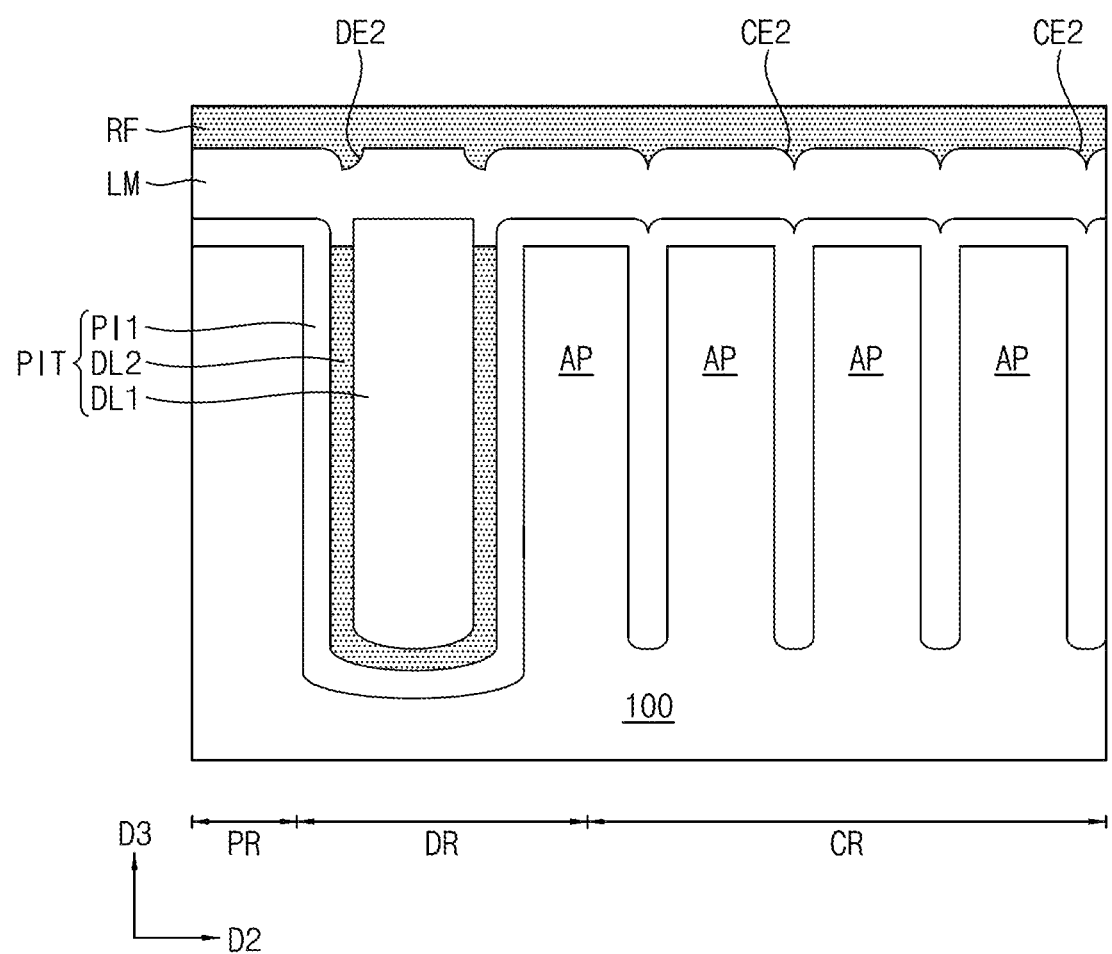
Figure 7B:
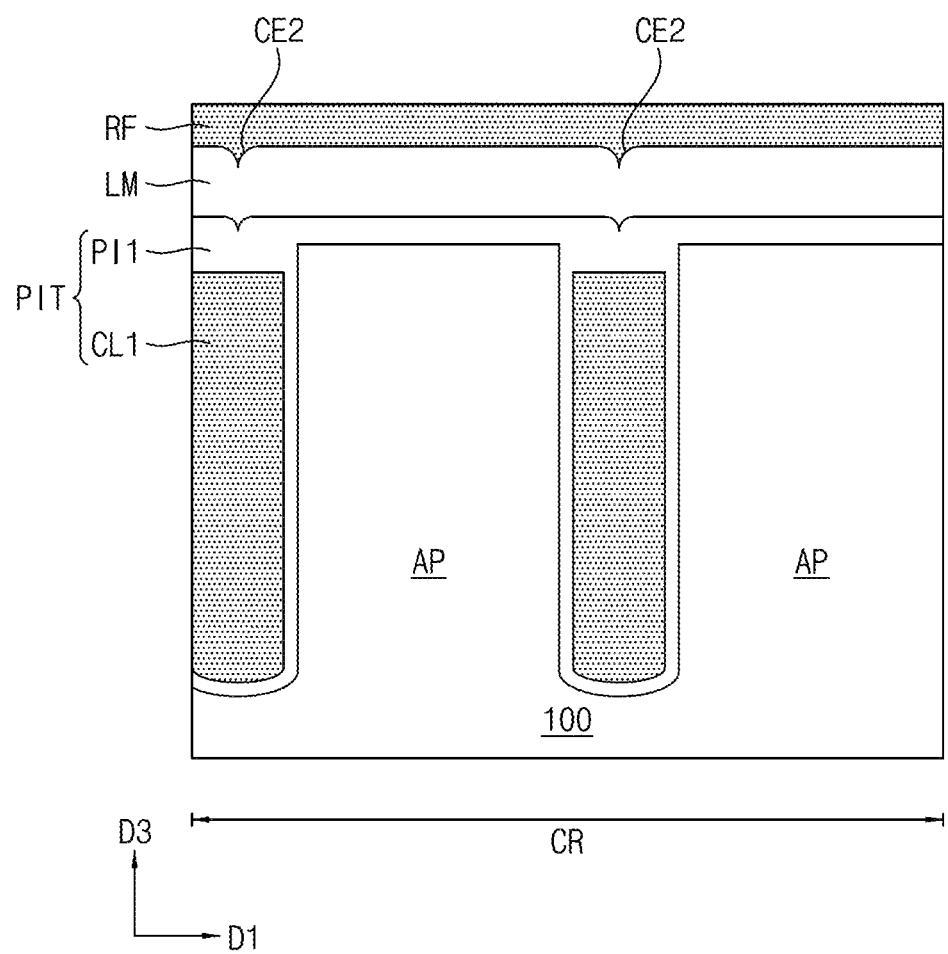
Figure 7C:
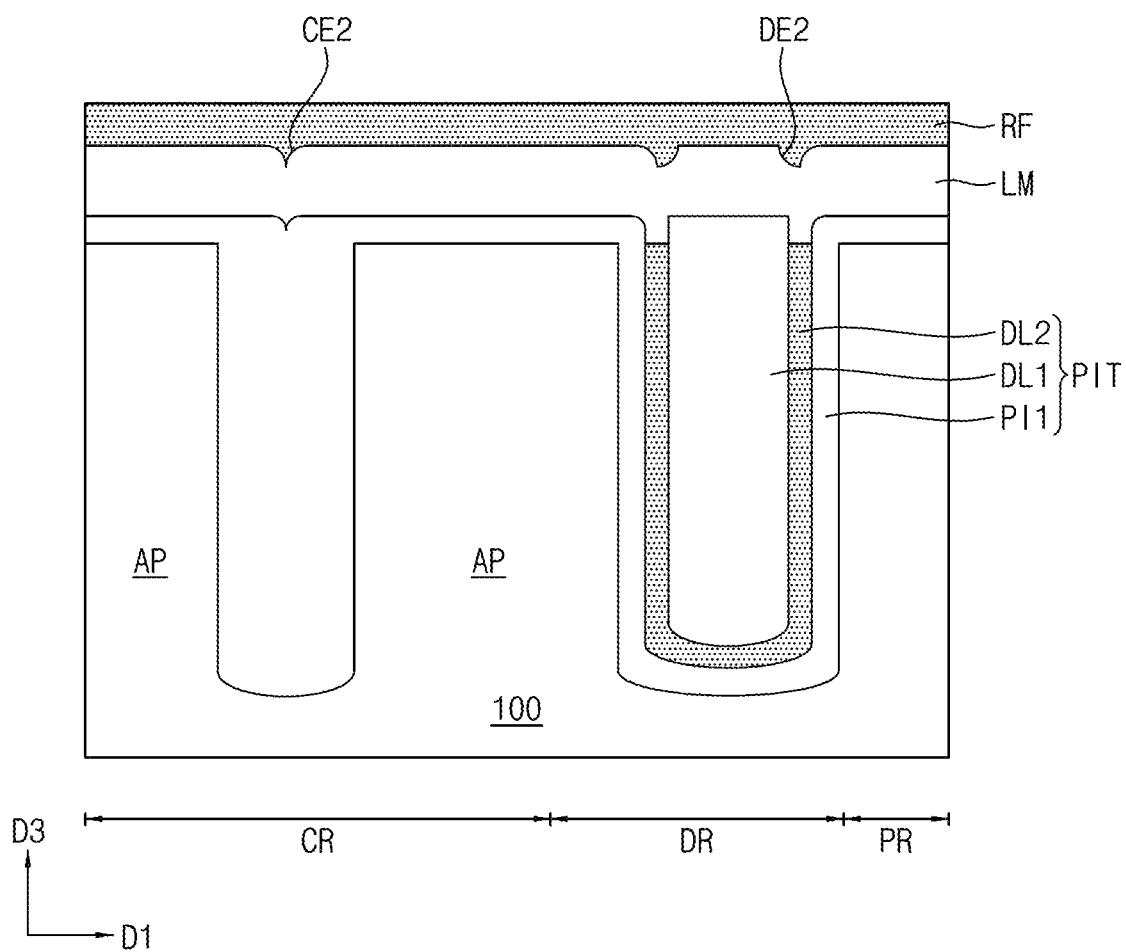

Referring to FIGS. 7A, 7B, and 7C, a recess filling layer RF may be formed on the lower mask layer LM. The recess filling layer RF may fill the second cell recesses CE2 and the second dummy recesses DE2.

The recess filling layer RF may have a greater maximum length (e.g., thickness) in the third direction D3 (for example, a vertical direction) than each of a depth of the second dummy recess DE2 and a depth of the second cell recess CE2. Accordingly, the recess filling layer RF may completely fill the second cell recess CE2 and the second dummy recess DE2. For example, the recess filling layer RF may overflow from the second dummy recess DE2 and the second cell recess CE2 such that an upper surface of the lower mask layer LM may be covered.

Figure 8A:
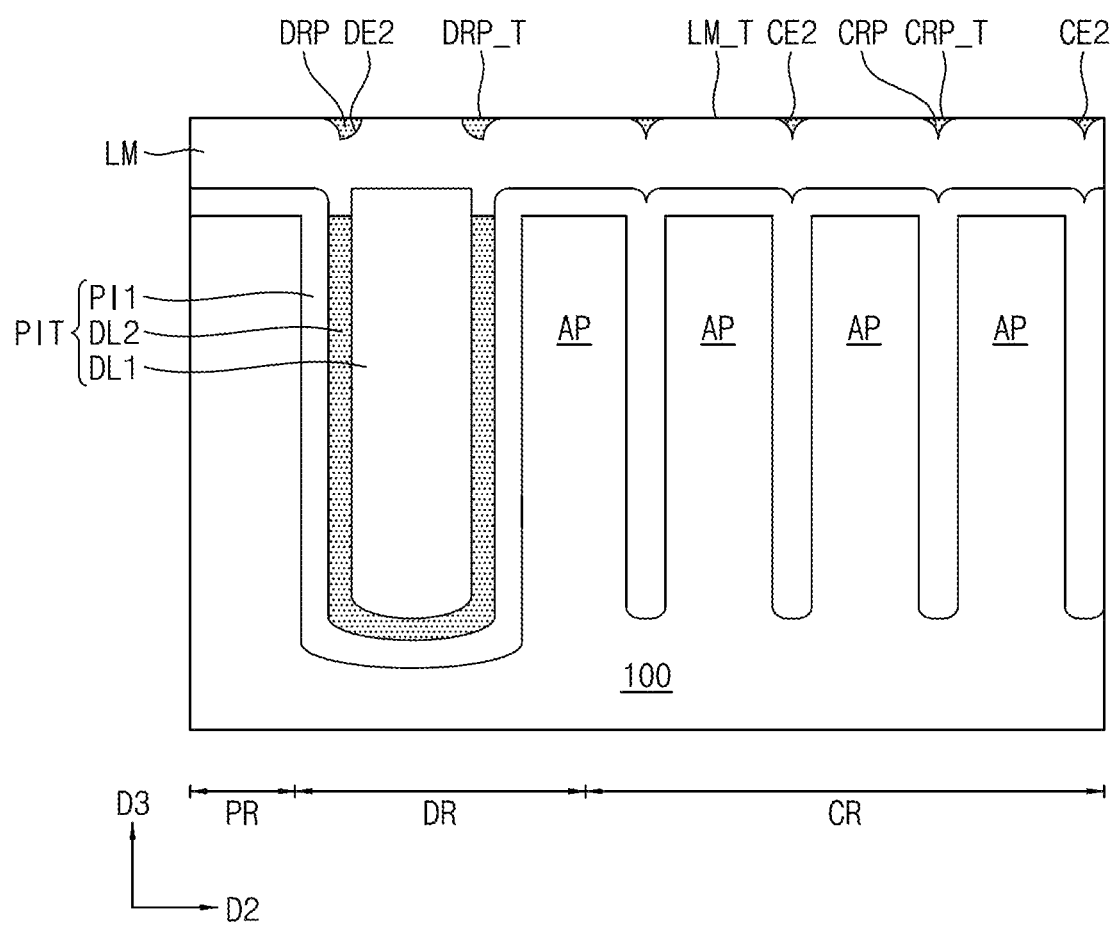
Figure 8B:
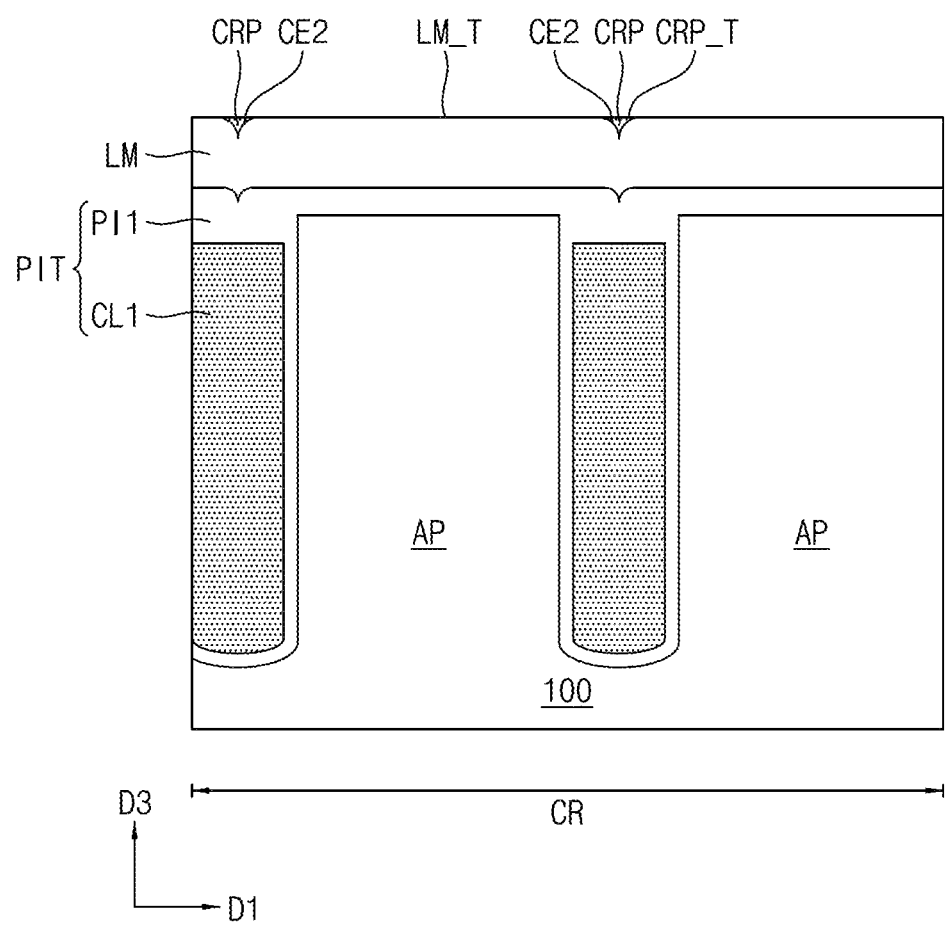
Figure 8C:
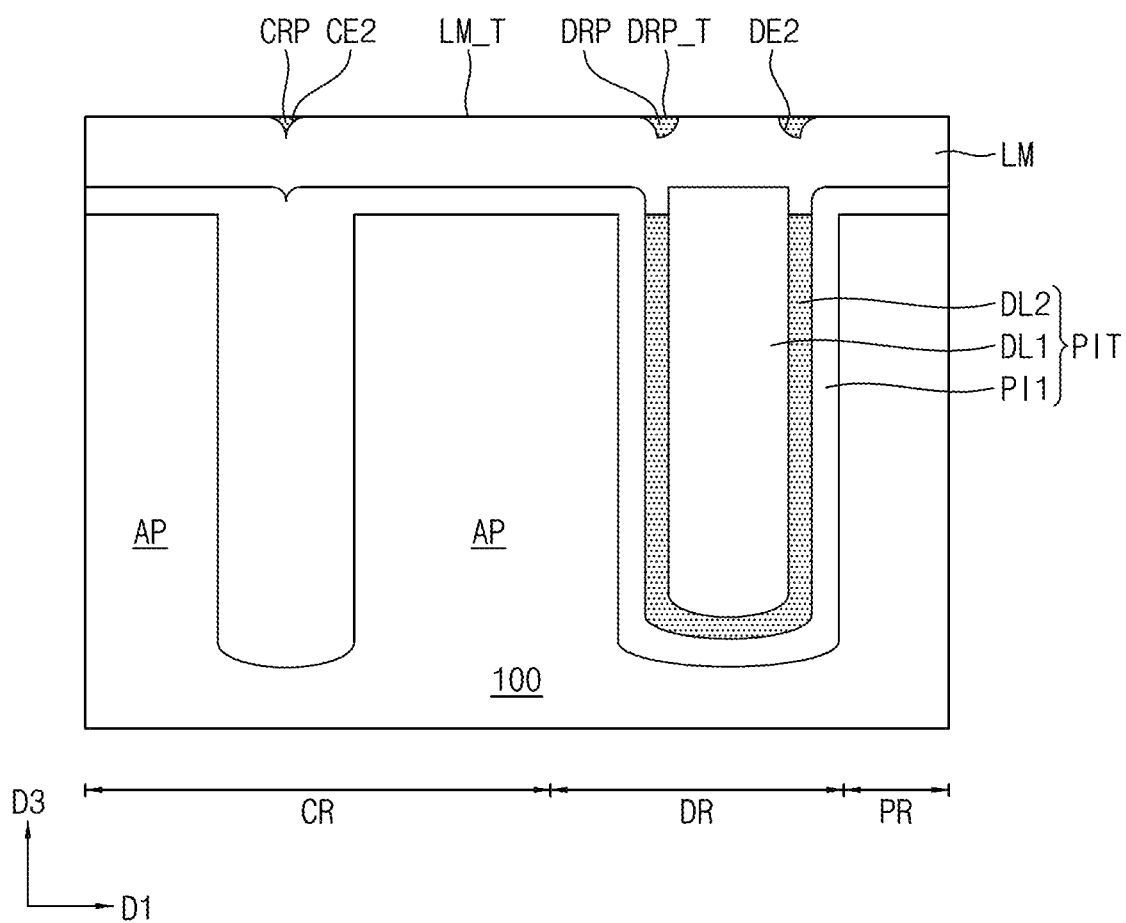

Referring to FIGS. 8A, 8B, and 8C, an upper portion of the recess filling layer RF may be removed. As the upper portion of the recess filling layer RF is removed, the recess filling layer RF may be separated into dummy recess filling patterns DRP and cell recess filling patterns CRP. The dummy recess filling pattern DRP may be provided in the second dummy recess DE2. The dummy recess filling pattern DRP may fill the second dummy recess DE2. The cell recess filling pattern CRP may be provided in the second cell recess CE2. The cell recess filling pattern CRP may fill the second cell recess CE2.

A top surface DRP_T of the dummy recess filling pattern DRP and a top surface CRP_T of the cell recess filling pattern CRP may have the same level as a top surface LM_T of the lower mask layer LM. The top surface DRP_T of the dummy recess filling pattern DRP, the top surface CRP_T of the cell recess filling pattern CRP, and the top surface LM_T of the lower mask layer LM may form a flat coplanar surface.

In an exemplary embodiment of the present inventive concept, the upper portion of the recess filling layer RF may be removed through a chemical mechanical polishing (CMP) process. The recess filling layer RF may include a material having selectivity with respect to the lower mask layer LM in the CMP process and, as such, the upper portion of the recess filling layer RF may be selectively removed. For example, when the lower mask layer LM includes silicon oxide, the recess filling layer RF may include silicon nitride, silicon carbonitride, polysilicon, or boron nitride.

Figure 9A:
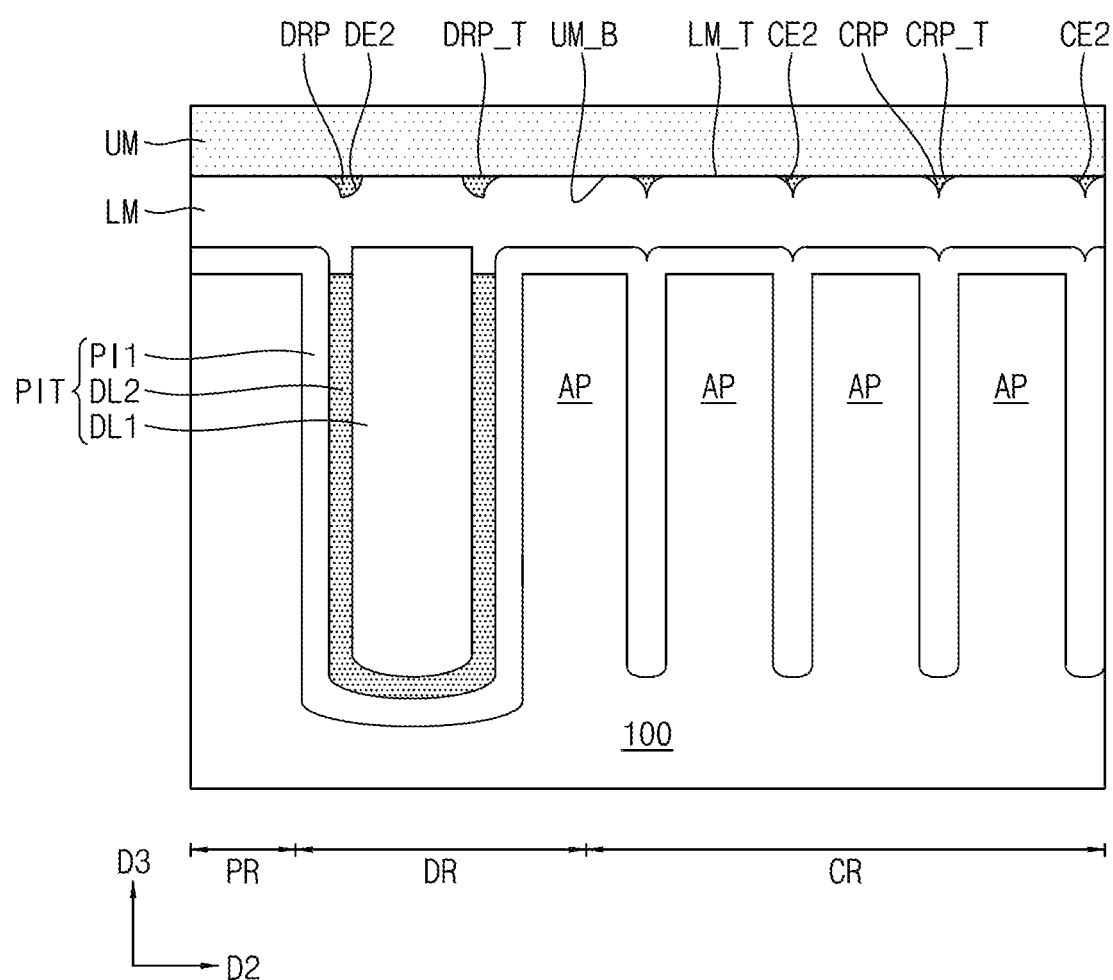
Figure 9B:
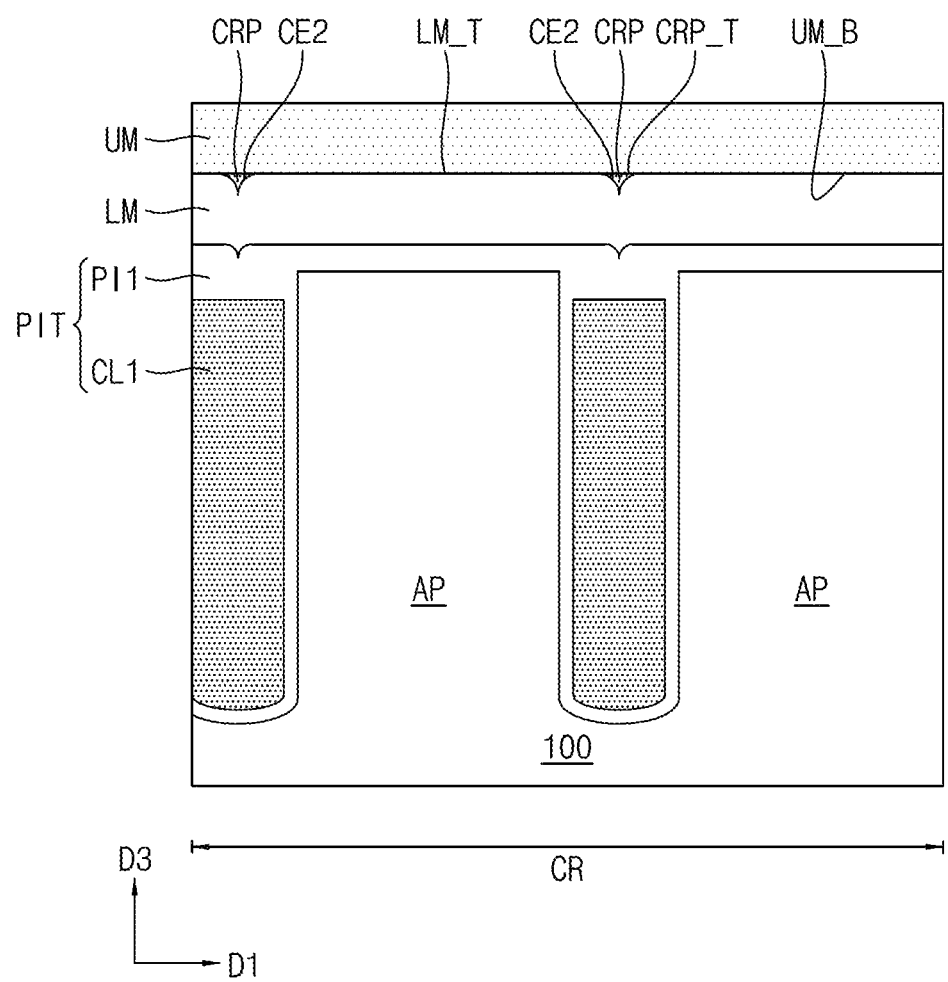
Figure 9C:
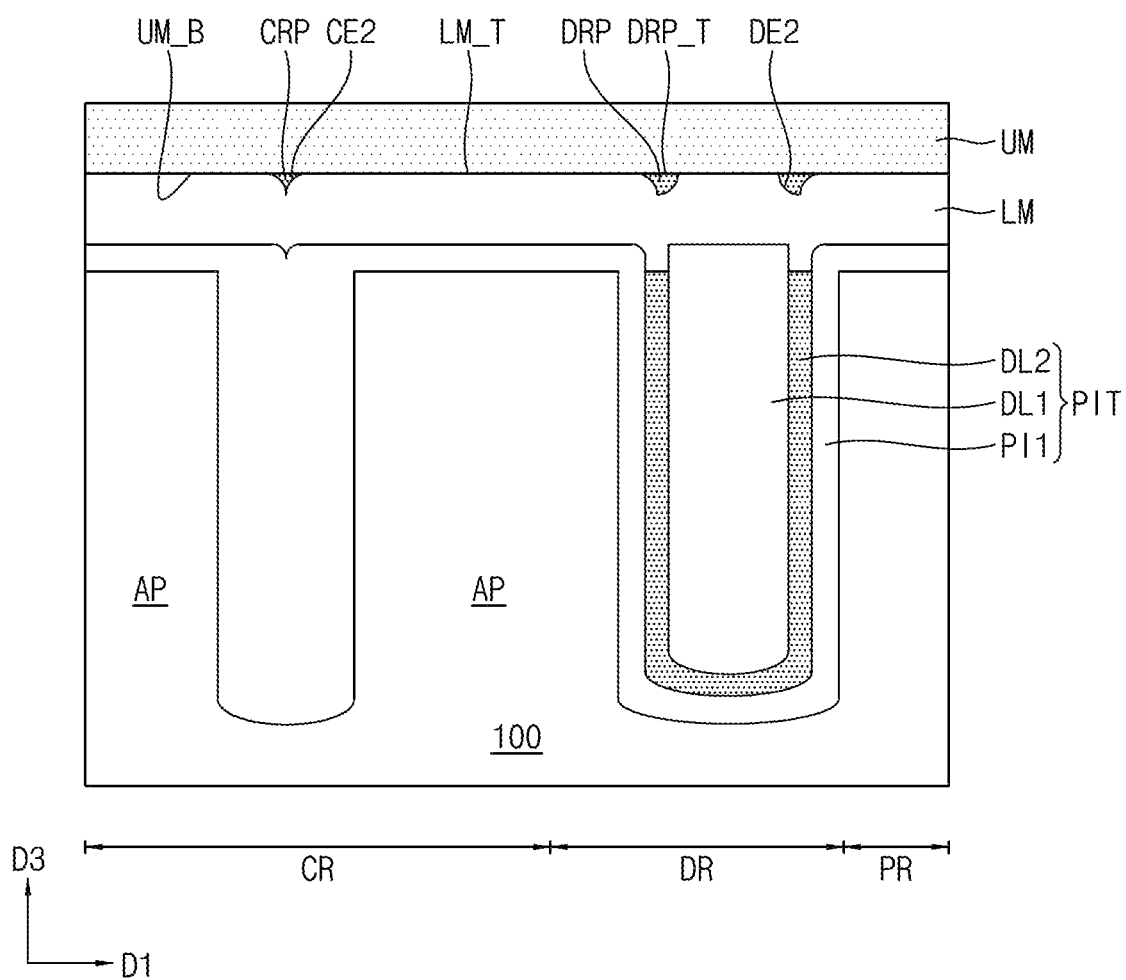

Referring to FIGS. 9A, 9B, and 9C, an upper mask layer UM may be formed on the dummy recess filling patterns DRP, the cell recess filling patterns CRP, and the lower mask layer LM. For example, a bottom surface UM_B of the upper mask layer UM may contact the top surfaces DRP_T of the dummy recess filling patterns DRP, the top surfaces CRP_T of the cell recess filling patterns CRP and the top surface LM_T of the lower mask layer LM. The bottom surface UM_B of the upper mask layer UM may be substantially flat.

Figure 10A:
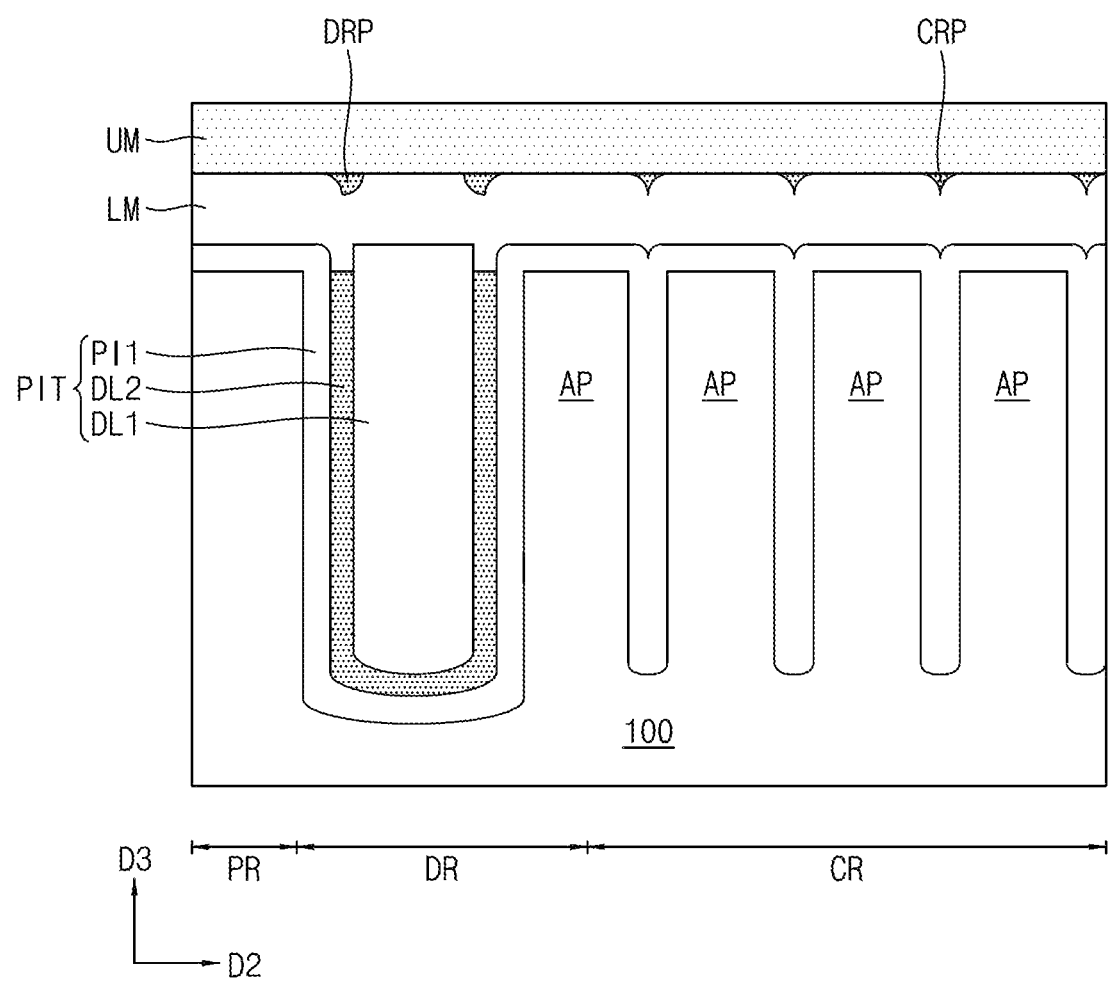
Figure 10B:
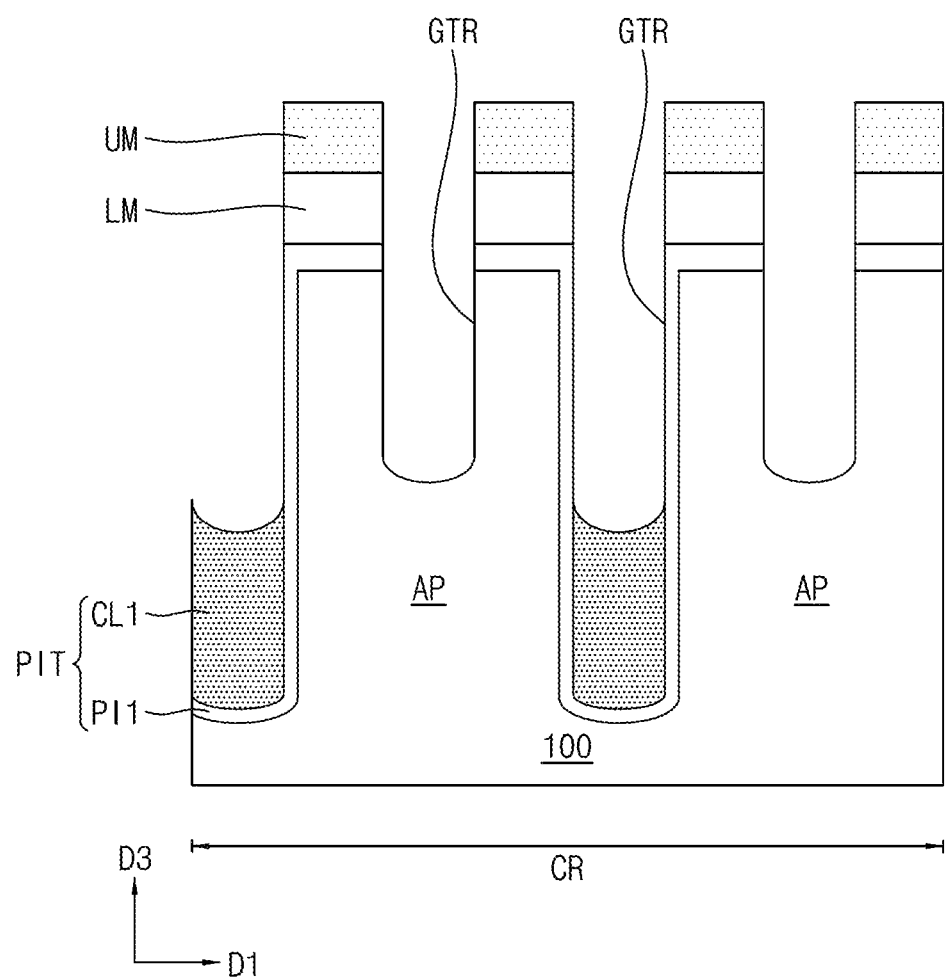
Figure 10C:
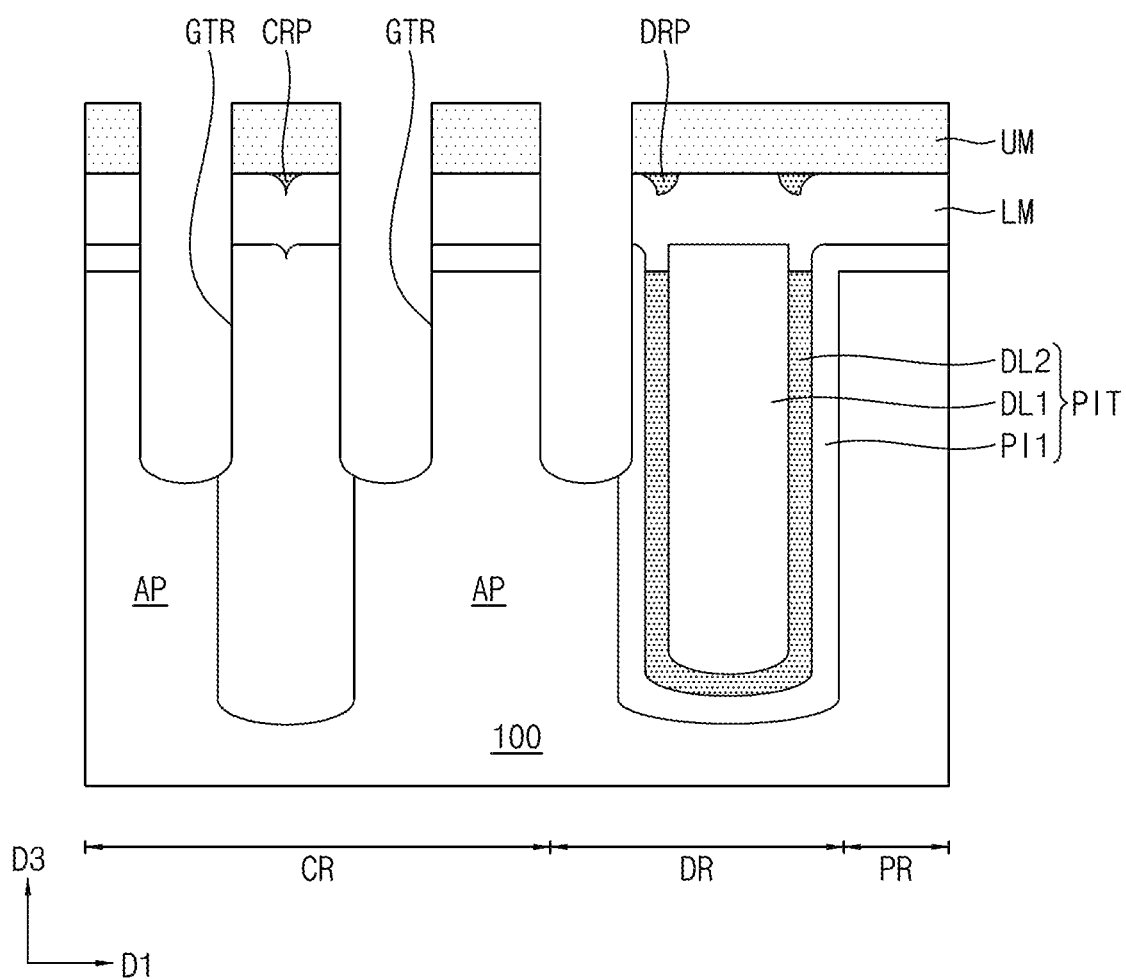

Referring to FIGS. 10A, 10B, and 10C, the lower mask layer LM and the upper mask layer UM may be patterned. Subsequently, gate trenches GTR may be formed using the patterned lower mask layer LM and the patterned upper mask layer UM as an etch mask. The gate trenches GTR may be formed by etching the active patterns AP, the first preliminary isolation layer PI1 and the first cell isolation layer CL1.

Figure 11A:
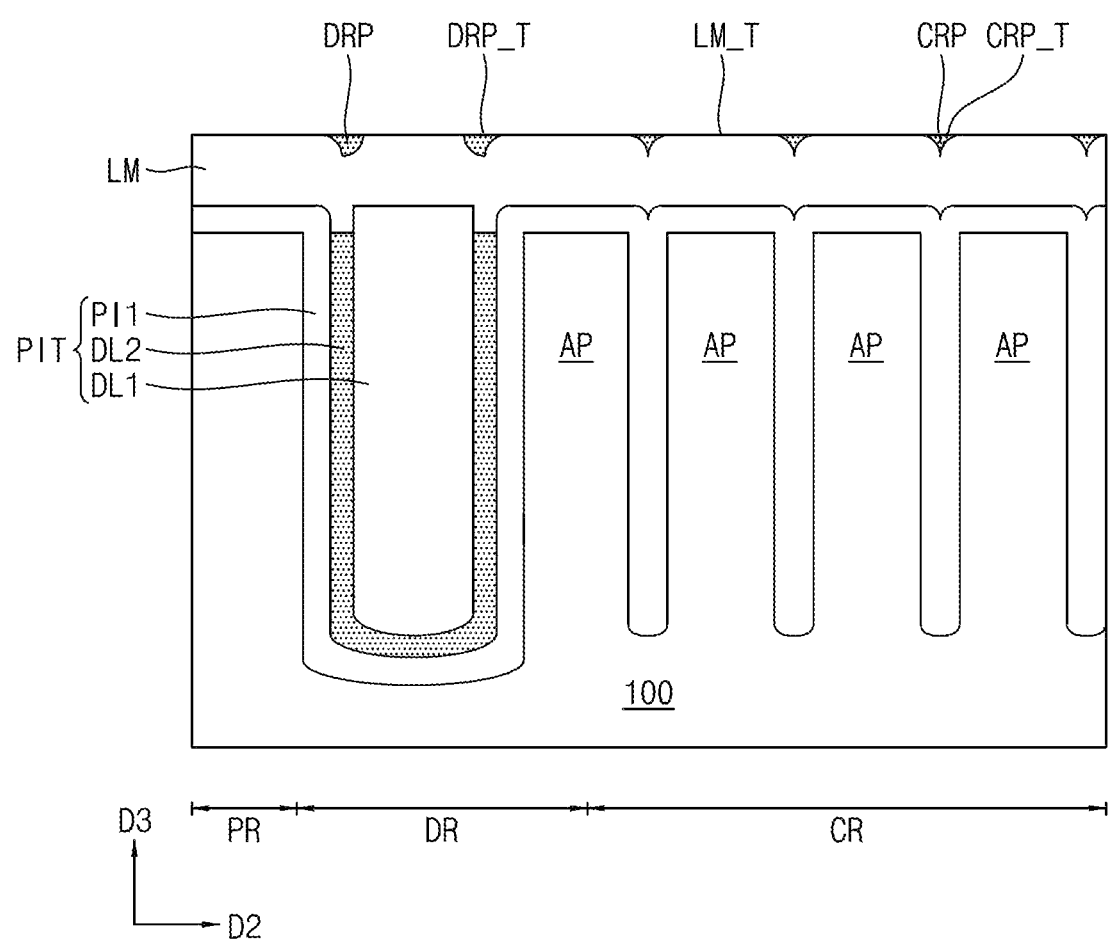
Figure 11B:
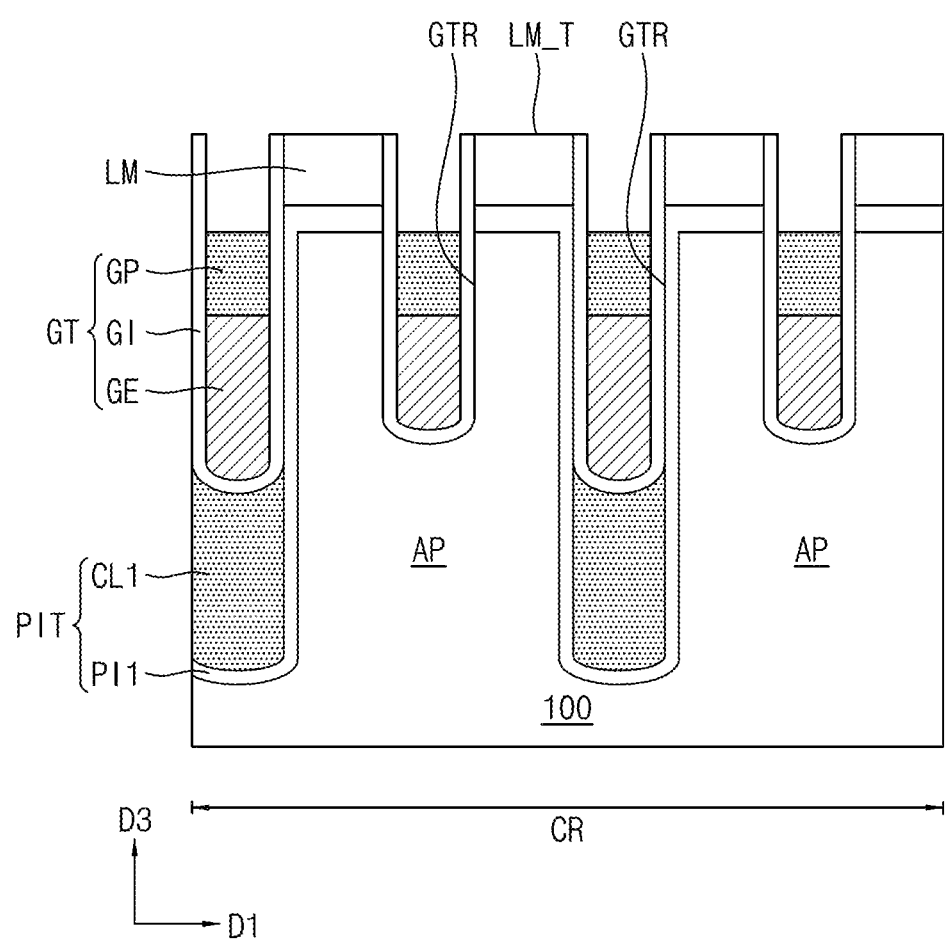
Figure 11C:
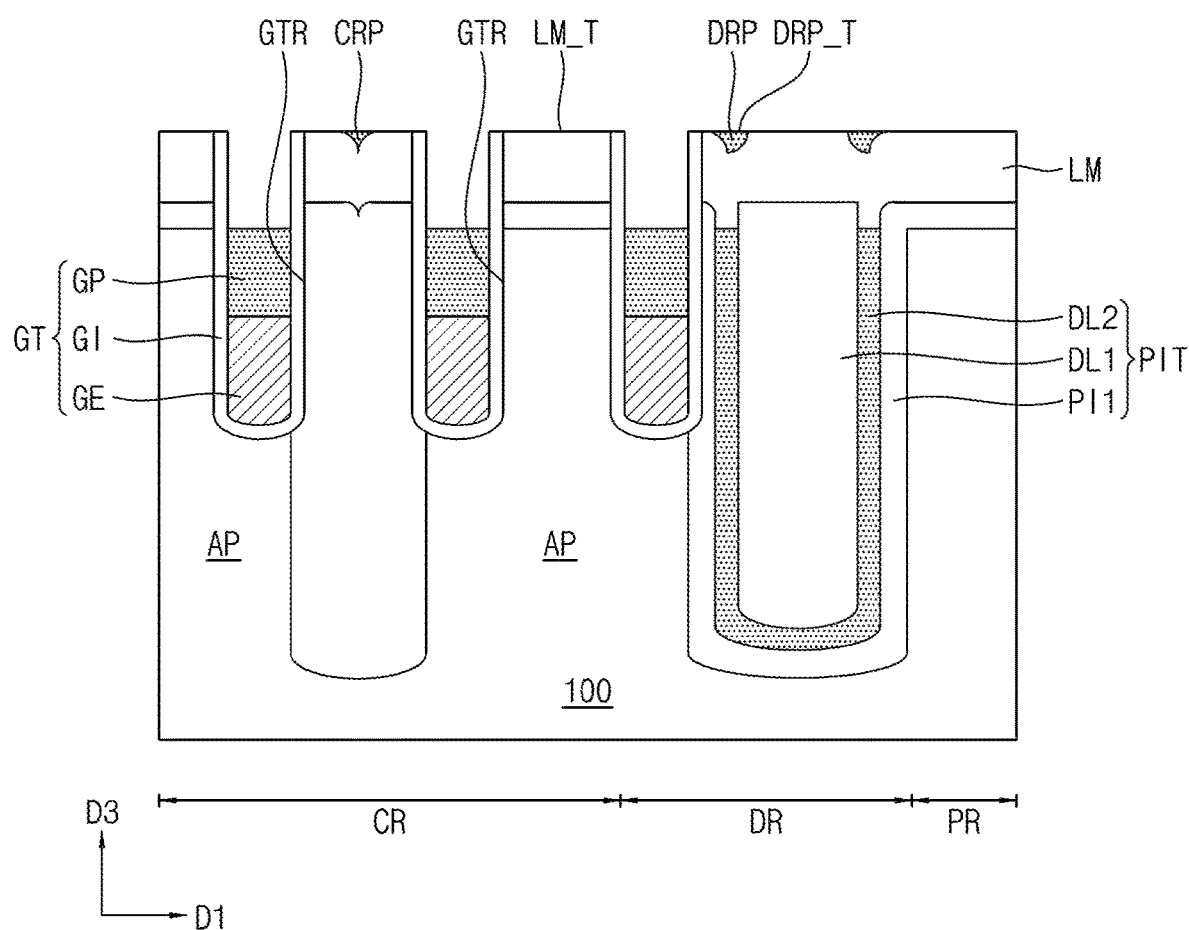

Referring to FIGS. 11A, 11B, and 11C, the upper mask layer UM may be removed. As the upper mask layer UM is removed, the top surface LM_T of the lower mask layer LM, the top surfaces DRP_T of the dummy recess filling patterns DRP, and the top surfaces CRP_T of the cell recess filling patterns CRP may be exposed. In an exemplary embodiment of the present inventive concept, the upper mask layer UM may be selectively removed through an etching process. The upper mask layer UM may include a material having selectivity with respect to the lower mask layer LM, the dummy recess filling patterns DRP and the cell recess filling patterns CRP in the etching process and, as such, may be selectively removed. For example, when the lower mask layer LM includes silicon oxide, and the dummy and cell recess filling patterns DRP and CRP include silicon nitride, silicon carbonitride, polysilicon, or boron nitride, the upper mask layer UM may include an amorphous carbon layer (ACL).

A gate structure GT may be formed in the gate trench GTR. Forming the gate structure GT may include forming a gate insulating layer GI, a gate electrode GE, and a gate capping layer GP. Forming the gate insulating layer GI may include forming a gate insulating material layer, and etching the gate insulating material layer, thereby forming the gate insulating layer GI. Forming the gate electrode GE may include forming a gate electrode material layer and etching the gate electrode material layer, thereby forming the gate electrode GE. Forming the gate capping layer GP may include forming a gate capping material layer and etching the gate capping material layer, thereby forming the gate capping layer GP.

Figure 12A:
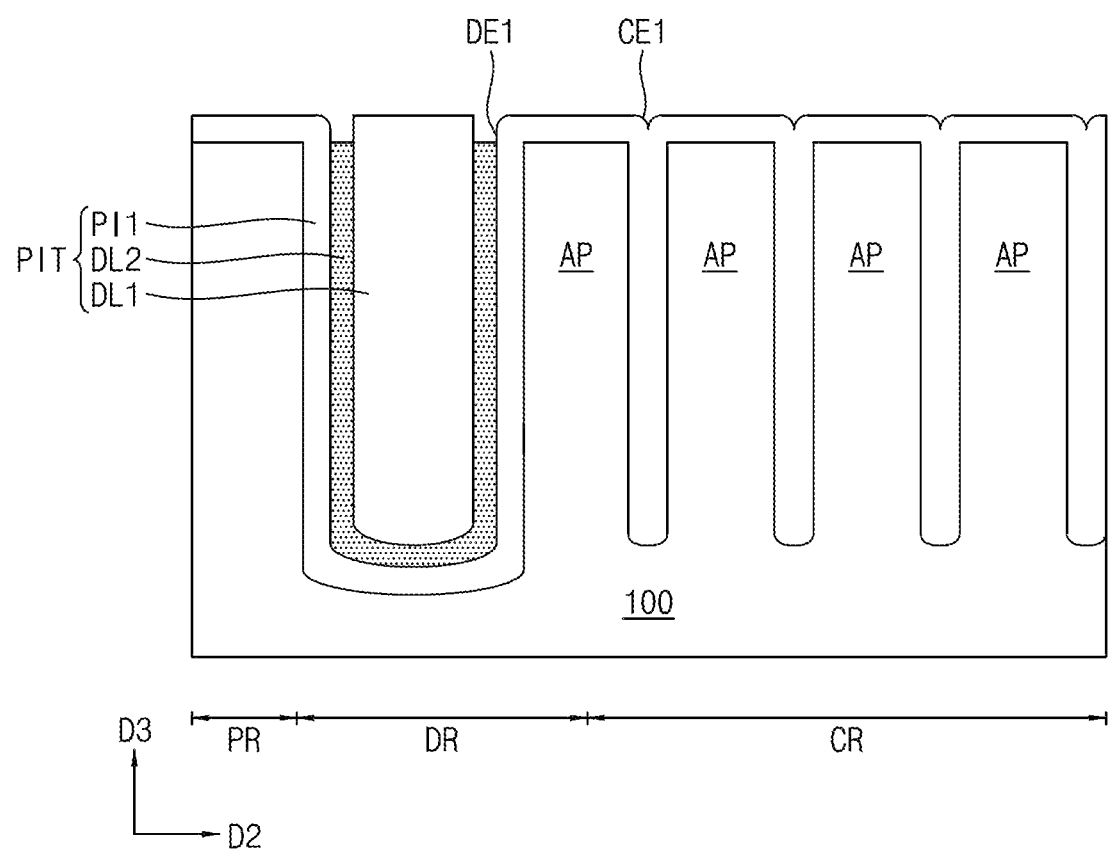
Figure 12B:
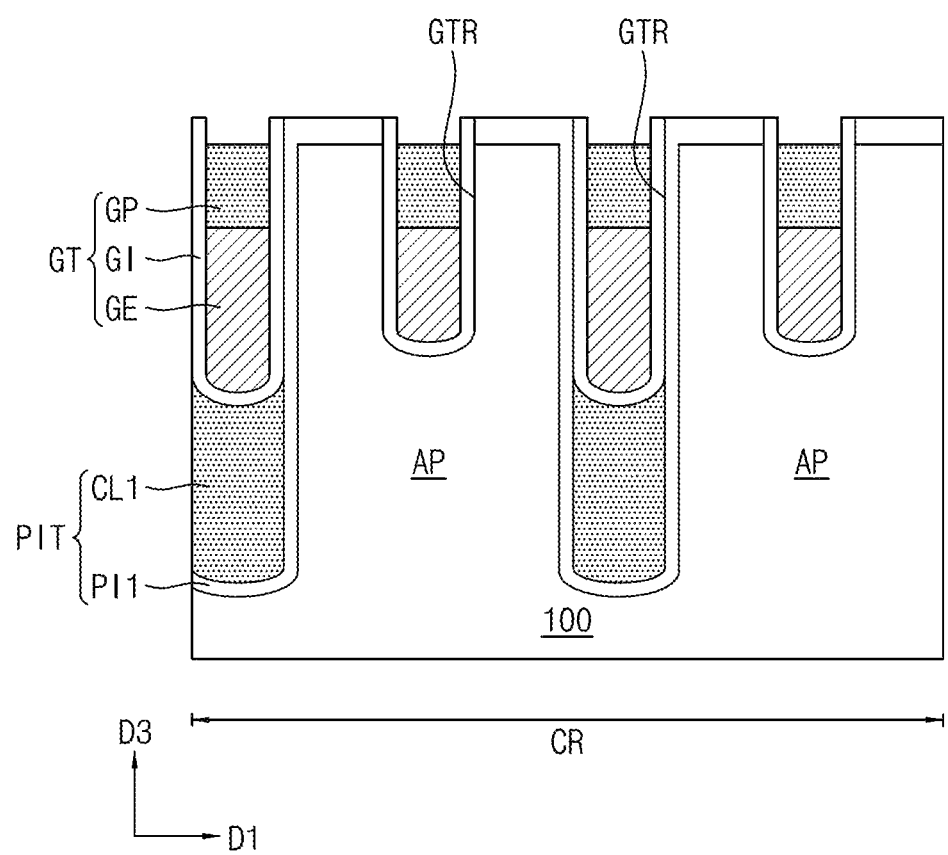
Figure 12C:
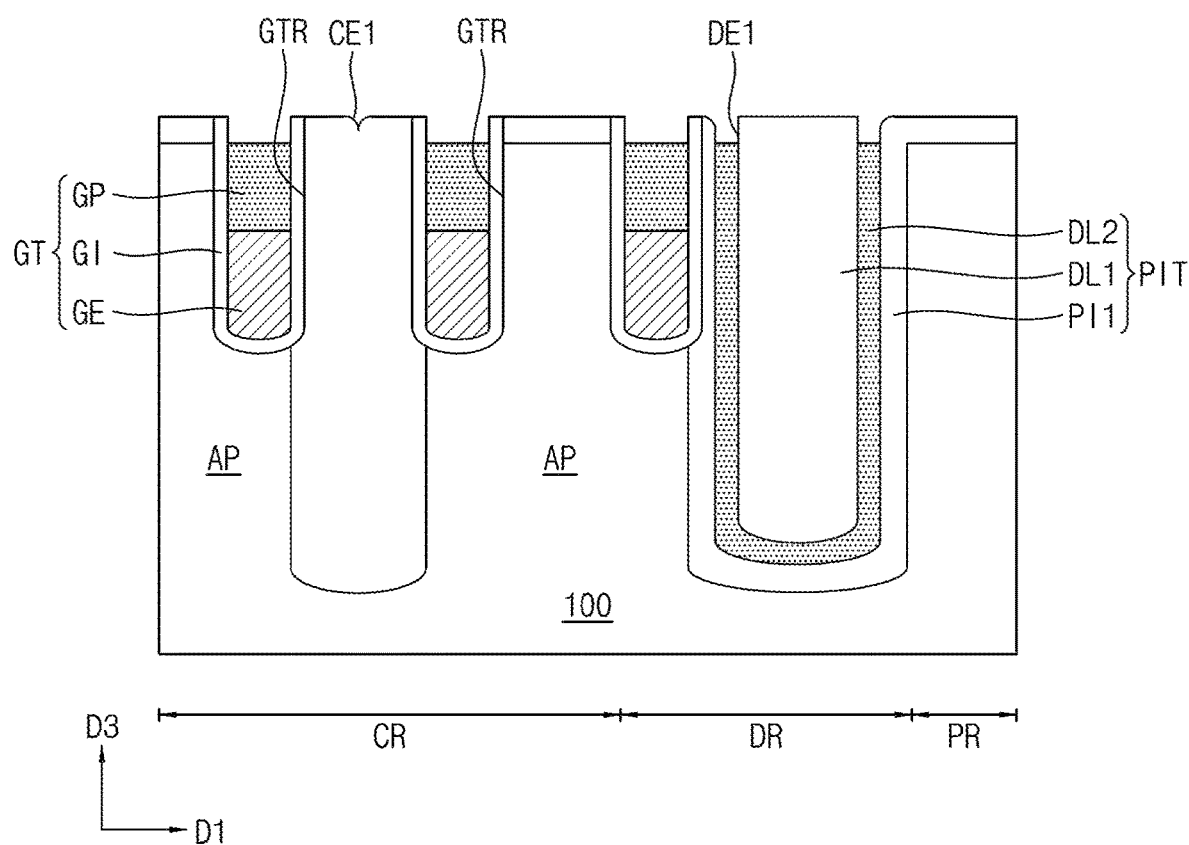

Referring to FIGS. 12A, 12B, and 12C, the lower mask layer LM, a portion of the gate insulating layer GI, the dummy recess filling patterns DRP, and the cell recess filling patterns CRP may be removed. In an exemplary embodiment of the present inventive concept, the lower mask layer LM, the dummy recess filling patterns DRP, and the cell recess filling patterns CRP may be simultaneously removed through an etching process performed once. The dummy recess filling patterns DRP and the cell recess filling patterns CRP may include a material having no selectivity with respect to the lower mask layer LM in the etching process and, as such, the lower mask layer LM, the dummy recess filling patterns DRP, and the cell recess filling patterns CRP may be simultaneously removed through the etching process performed once. For example, when the lower mask layer LM includes silicon oxide, the dummy recess filling patterns DRP and the cell recess filling patterns CRP may include silicon nitride, silicon carbonitride, polysilicon, or boron nitride. As the lower mask layer LM is removed, the first cell recesses CE1 and the first dummy recesses DE1 may be exposed.

Figure 13A:
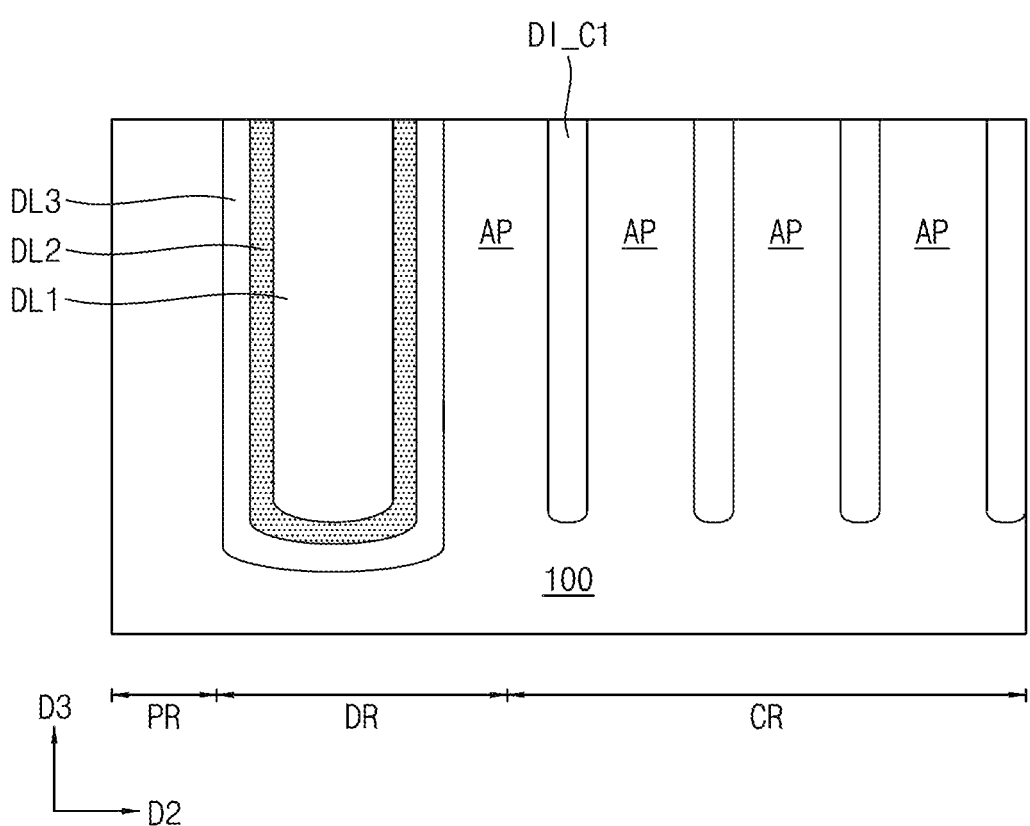
Figure 13B:
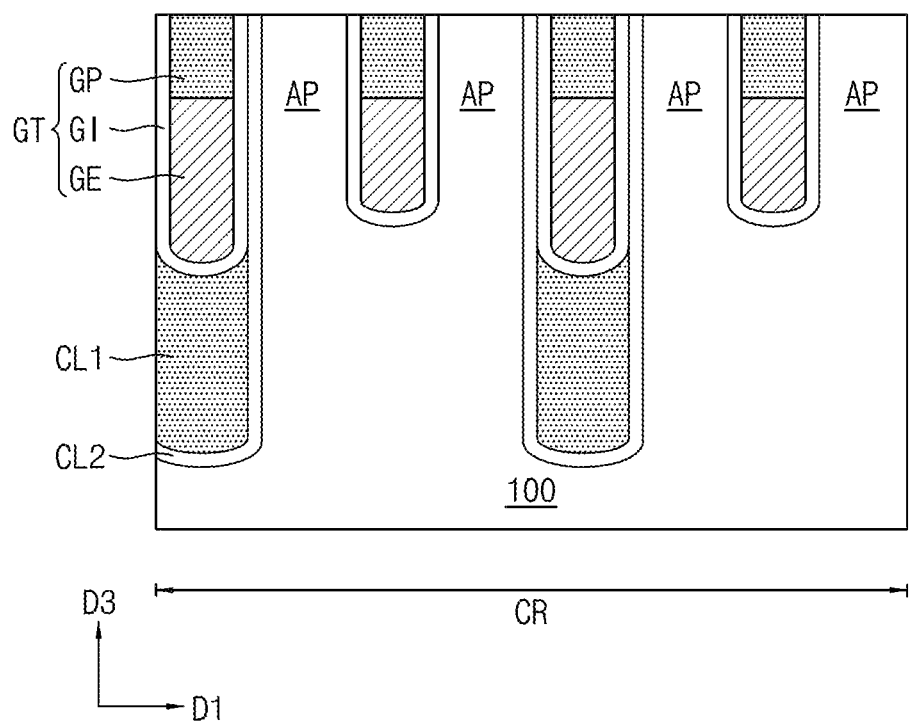
Figure 13C:
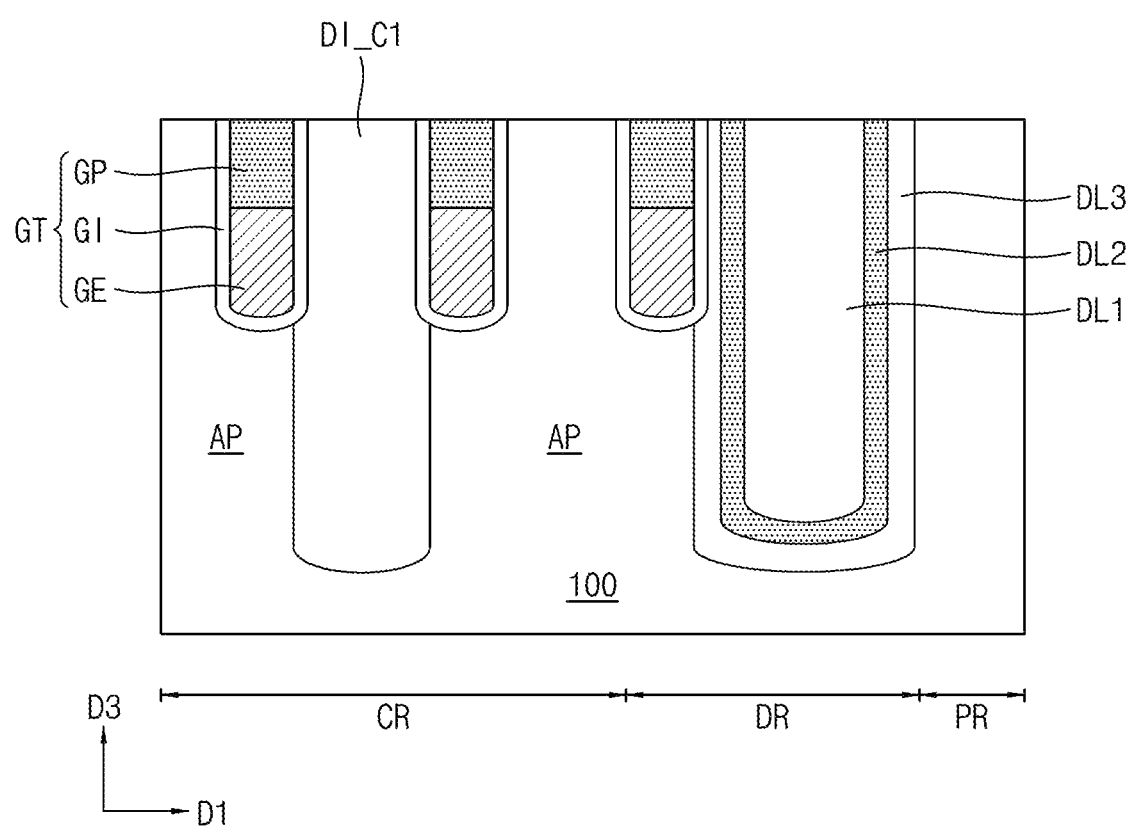

Referring to FIGS. 13A, 13B, and 13C, an upper portion of the first preliminary isolation layer PI1, a portion of the gate insulating layer GI, and a portion of the first dummy isolation layer DL1 may be removed. In an exemplary embodiment of the present inventive concept, the upper portion of the first preliminary isolation layer PI1, the portion of the gate insulating layer GI, and the portion of the first dummy isolation layer DL1 may be removed through an etching process. For example, the etching process may be performed once.

As the upper portion of the first preliminary isolation layer PI1 is removed, the first preliminary isolation layer PI1 may be separated into third dummy isolation layers DL3, second cell isolation layers CL2, and first cell isolation portions DI_C1.

Referring to FIGS. 1A, 1B, 1C, and 1D, insulating patterns 110, bit line structures BT, buried contacts BC, insulating fences 120, landing pads LP, a first cover layer 130, an insulating structure 140, an interlayer insulating layer 150, a capacitor structure CT, and a second cover layer 160 may be formed through a subsequent process.

In accordance with the semiconductor device manufacturing method according to an exemplary embodiment of the present inventive concept, the dummy and cell recess filling patterns DRP and CRP may be formed on the lower mask layer LM and, as such, may fill the second dummy recesses DE2 and the second cell recesses CE2 formed in the lower mask layer LM.

As the second dummy recesses DE2 and the second cell recesses CE2 are filled with the dummy and cell recess filling patterns DRP and CRP, residual portions of the upper mask layer UM may be prevented from remaining in the second dummy recesses DE2 and the second cell recesses CE2, and a phenomenon in which the lower mask layer LM is incompletely removed due to the residual portions of the upper mask layer UM may be prevented. As the upper and lower mask layers UM and LM are completely removed, process failure caused by residual portions of the upper and lower mask layers UM and LM may be prevented.

As the second dummy recesses DE2 and the second cell recesses CE2 are filled with the dummy and cell recess filling patterns DRP and CRP, no recess may be formed at the top surface of the upper mask layer UM and, as such, weakness caused by recesses of the upper mask layer UM in a process using the upper mask layer UM as a mask may be eliminated.

Figure 14A:
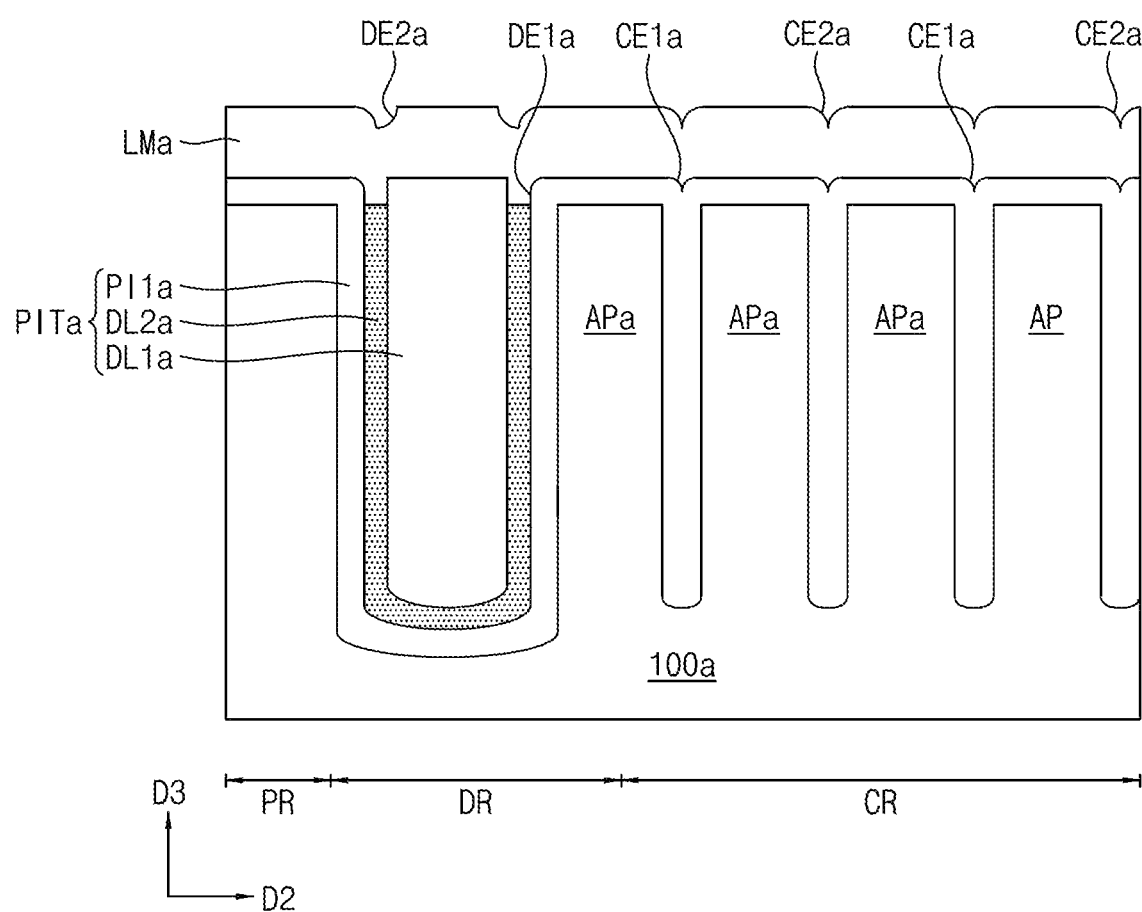
FIGS. 14A, 14B, and 14C are cross-sectional views showing a manufacturing method of a semiconductor device according to an exemplary embodiment of the present inventive concept.
Figure 14B:
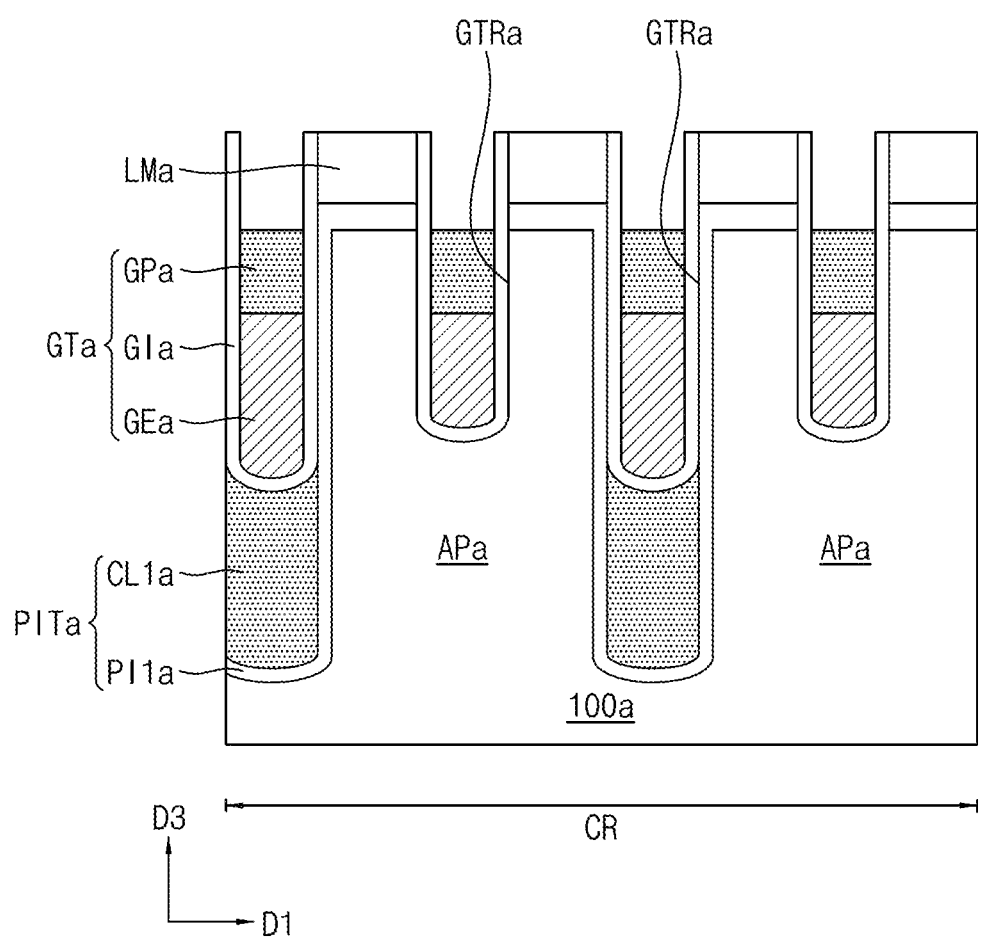
Figure 14C:
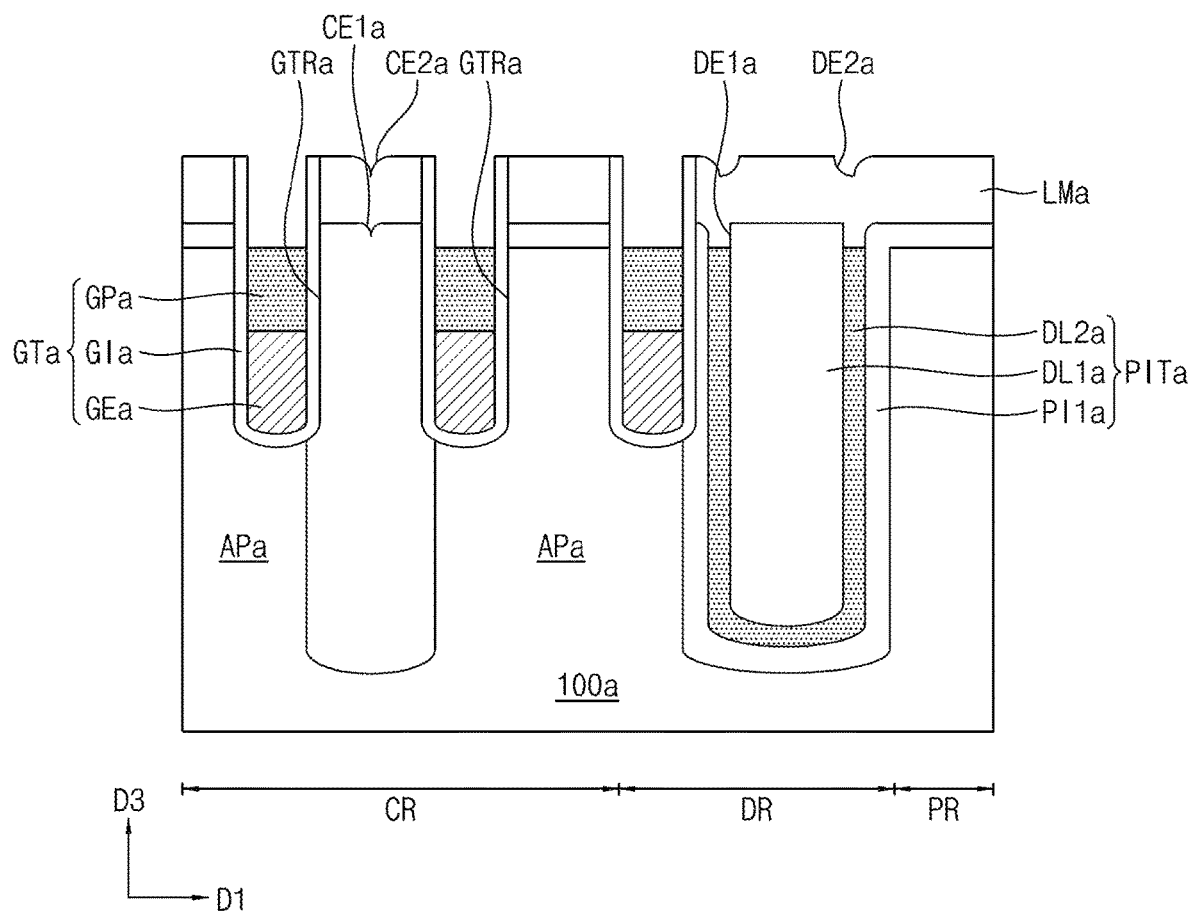

FIGS. 14A, 14B, and 14C are cross-sectional views showing a manufacturing method of a semiconductor device according to an exemplary embodiment of the present inventive concept. FIG. 14A corresponds to line A-A' in FIG. 1A. FIG. 14B corresponds to line B-B' in FIG. 1A. FIG. 14C corresponds to line C-C' in FIG. 1A.

Referring to FIGS. 14A, 14B, and 14C, similarly to the description given with reference to FIGS. 2A to 10C, active patterns APa may be formed at a substrate 100a, and a preliminary isolation structure PITa including a first preliminary isolation layer PI1a, a first dummy isolation layer DL1a, a second dummy isolation layer DL2a, and a first cell isolation layer CL1a may then be formed. First cell recesses CE1a and first dummy recesses DE1a may be defined by the preliminary isolation structure PITa. For example, the first cell recesses CE1a and first dummy recesses DE1a may be formed in the preliminary isolation structure PITa. A lower mask layer LMa may be formed, and second cell recesses CE2a and second dummy recesses DE2a may be formed in the lower mask layer LMa. Cell and dummy recess filling patterns filling the second cell recesses CE2a and the second dummy recesses DE2a may be formed, and an upper mask layer may then be formed on the lower mask layer LMa.

Gate trenches GTRa may be formed using the upper mask layer and the lower mask layer LMa as a mask, and the upper mask layer may then be removed. A gate structure GTa including a gate insulating layer GIa, a gate electrode GEa, and a gate capping layer GPa may be formed.

A gate capping material layer for formation of the gate capping layer GPa and the dummy and cell recess filling patterns may include the same material. For example, the gate capping material layer and the dummy and cell recess filling patterns may include a nitride. As the gate capping material layer and the dummy and cell recess filling patterns include the same material, the dummy and cell recess filling patterns may be etched simultaneously with the gate capping material layer in a process for etching the gate capping material layer to form the gate capping layer GPa. The dummy and cell recess filling patterns may be removed through etching and, as such, the second cell recesses CE2a and the second dummy recesses DE2a may be exposed.

Subsequently, similarly to the description given with reference to FIGS. 12A and 13C, the lower mask layer LMa may be removed, and an upper portion of the first preliminary isolation layer PI1a may then be removed, thereby forming a third dummy isolation layer, a second cell isolation layer, and a first cell isolation portion. Thereafter, similarly to the description given with reference to FIGS. 1A to 1D, remaining constituent elements of the semiconductor device may be formed.

In the semiconductor device manufacturing method according to an exemplary embodiment of the present inventive concept, the recess filling patterns filling the recesses formed in the lower mask layer may be formed, thereby preventing formation of residual portions of the upper mask layer and the lower mask layer, and, as such, process failure caused by the residual portions of the upper mask layer and the lower mask layer may be prevented.

While the present inventive concept has been described with reference to embodiments thereof, it will be understood by those of ordinary skill in the art that various changes in form and details may be made thereto without departing from the spirit and scope of the present inventive concept

What is claimed is:
1. A manufacturing method of a semiconductor device comprising:
    etching a substrate, thereby forming a cell trench and a dummy trench;
    forming a preliminary isolation structure on the substrate, wherein a first dummy recess is formed in the preliminary isolation structure and overlaps with the dummy trench;
    forming a lower mask layer on the preliminary isolation structure, wherein a second dummy recess is formed in the lower mask layer and overlaps with the first dummy recess;
    forming a dummy recess filling pattern filling the second dummy recess;
    forming an upper mask layer on the lower mask layer and the dummy recess filling pattern;
    forming a gate trench using the lower mask layer and the upper mask layer as a mask; and
    forming a gate structure in the gate trench.

2. The manufacturing method according to claim 1, wherein:
    forming the preliminary isolation structure comprises:
        forming a first preliminary isolation layer on the substrate;
        forming a second preliminary isolation layer on the first preliminary isolation layer;
        forming a first dummy isolation layer on the second preliminary isolation layer such that the first dummy isolation layer fills the dummy trench; and
        removing an upper portion of the second preliminary isolation layer, thereby forming a second dummy isolation layer,
    wherein the first dummy recess is formed by the first dummy isolation layer, the second dummy isolation layer, and the first preliminary isolation layer.

3. The manufacturing method according to claim 1, wherein the second dummy recess is a recessed portion of a top surface of the lower mask layer.

4. The manufacturing method according to claim 1, wherein the forming a dummy recess filling pattern comprises forming a recess filling layer on the lower mask layer, and removing an upper portion of the recess filling layer.

5. The manufacturing method according to claim 4, wherein removing the upper portion of the recess filling layer comprises selectively removing the upper portion of the recess filling layer through a chemical mechanical polishing (CMP) process.

6. The manufacturing method according to claim 5, wherein the recess filling layer comprises a material having selectivity with respect to the lower mask layer in the CMP process.

7. The manufacturing method according to claim 6, wherein:
the lower mask layer comprises silicon oxide, and
the recess filling layer comprises silicon nitride, silicon carbonitride, polysilicon, or boron nitride.

8. A manufacturing method of a semiconductor device comprising:
etching a substrate, thereby forming a cell trench and a dummy trench;
forming a lower mask layer over the substrate, wherein the lower mask layer includes a cell recess and a dummy recess, wherein the cell recess overlaps with the cell trench, and the dummy recess overlaps with the dummy trench;
forming a dummy recess filling pattern, which fills the dummy recess, and a cell recess filling pattern, which fills the cell recess;
forming an upper mask layer on the lower mask layer, the dummy recess filling pattern and the cell recess filling pattern;
forming a gate trench using the lower mask layer and the upper mask layer as a mask; and
forming a gate structure in the gate trench.

9. The manufacturing method according to claim 8, wherein the cell recess and the dummy recess are recessed portions of a top surface of the lower mask layer.

10. The manufacturing method according to claim 8, wherein a top surface of the cell recess filling pattern, a top surface of the dummy recess filling pattern, and a top surface of the lower mask layer form a flat coplanar surface.

11. The manufacturing method according to claim 8, further comprising:
removing the upper mask layer; and
simultaneously removing the lower mask layer, the cell recess filling pattern and the dummy recess filling pattern through a first etching process.

12. The manufacturing method according to claim 11, wherein the cell recess filling pattern and the dummy recess filling pattern do not have selectivity with respect to the lower mask layer in the first etching process.

13. The manufacturing method according to claim 12, wherein:
the lower mask layer comprises silicon oxide, and
the cell recess filling pattern and the dummy recess filling pattern comprise silicon nitride, silicon carbonitride, polysilicon, or boron nitride.

14. The manufacturing method according to claim 11, wherein:
removing the upper mask layer comprises removing the upper mask layer through a second etching process, and
the upper mask layer comprises a material having selectivity with respect to the cell recess filling pattern, the dummy recess filling pattern and the lower mask layer in the second etching process.

15. A manufacturing method of a semiconductor device comprising:
etching a substrate, thereby forming a cell trench and a dummy trench;
forming a first preliminary isolation layer on the substrate;
forming a second preliminary isolation layer on the first preliminary isolation layer;
forming a first dummy isolation layer in the dummy trench and on the second preliminary isolation layer;
removing an upper portion of the second preliminary isolation layer, thereby forming a second dummy isolation layer between the first preliminary isolation layer and the first dummy isolation layer, wherein the first and second dummy isolation layers and the first preliminary isolation layer defines a first dummy recess overlapping with the dummy trench;
forming a lower mask layer that fills the first dummy recess, wherein the lower mask layer includes a second dummy recess overlapping with the first dummy recess;
forming a recess filling layer on the lower mask layer;
removing an upper portion of the recess filling layer, thereby forming a dummy recess filling pattern that fills the second dummy recess;
forming an upper mask layer on the lower mask layer and the dummy recess filling pattern;
forming a gate trench using the upper mask layer and the lower mask layer as a mask; and
forming a gate structure in the gate trench.

16. The manufacturing method according to claim 15, wherein the first dummy recess is an empty space provided between the first dummy isolation layer and the first preliminary isolation layer.

17. The manufacturing method according to claim 15, wherein the recess filling layer has a greater thickness in a vertical direction than a depth of the second dummy recess.

18. The manufacturing method according to claim 15, wherein:
a bottom surface of the upper mask layer contacts a top surface of the lower mask layer and a top surface of the dummy recess filling pattern, and
the bottom surface of the upper mask layer is substantially flat.

19. The manufacturing method according to claim 15, wherein:
forming the gate structure comprises forming a gate insulating layer in the gate trench, forming a gate electrode on the gate insulating layer, and forming a gate capping layer on the gate electrode, and
wherein the forming of the gate capping layer comprises forming a gate capping material layer, and simultaneously etching the gate capping material layer and the dummy recess filling pattern.

20. The manufacturing method according to claim 19, wherein the gate capping layer and the dummy recess filling pattern comprise a same material.

* * * * *